(12) United States Patent
Kato

(10) Patent No.: US 8,654,310 B2
(45) Date of Patent: Feb. 18, 2014

(54) EXPOSURE METHOD, EXPOSURE APPARATUS, PHOTOMASK AND METHOD FOR MANUFACTURING PHOTOMASK

(75) Inventor: Masaki Kato, Yokohama (JP)

(73) Assignee: Nikon Corporation, Tokyo (JP)

( * ) Notice: Subject to any disclaimer, the term of this patent is extended or adjusted under 35 U.S.C. 154(b) by 479 days.

(21) Appl. No.: 12/848,748

(22) Filed: Aug. 2, 2010

(65) Prior Publication Data

US 2010/0315611 A1   Dec. 16, 2010

Related U.S. Application Data

(63) Continuation of application No. 11/704,199, filed on Feb. 9, 2007, now Pat. No. 8,159,649.

(60) Provisional application No. 60/853,451, filed on Oct. 23, 2006.

(30) Foreign Application Priority Data

Feb. 16, 2006  (JP) ................................. 2006-039372
Oct. 13, 2006  (JP) ................................. 2006-279389

(51) Int. Cl.
  *G03B 27/42*  (2006.01)
(52) U.S. Cl.
  USPC ............................................... 355/53; 430/5
(58) Field of Classification Search
  USPC .................. 355/53, 67, 77; 716/19–21; 430/5
  See application file for complete search history.

(56) References Cited

U.S. PATENT DOCUMENTS

| | | |
|---|---|---|
| 5,715,037 A | 2/1998 | Saiki et al. |
| 5,729,331 A | 3/1998 | Tanaka et al. |
| 6,512,573 B2 | 1/2003 | Furter |
| 6,515,734 B1 | 2/2003 | Yamada et al. |
| 6,552,775 B1 | 4/2003 | Yanagihara et al. |
| 8,159,649 B2 | 4/2012 | Kato |
| 2002/0039180 A1* | 4/2002 | Furter ............................. 355/67 |
| 2004/0061673 A1 | 4/2004 | Ishikawa et al. |

(Continued)

FOREIGN PATENT DOCUMENTS

| | | |
|---|---|---|
| DE | 197 57 074 A1 | 6/1999 |
| JP | A-07-057986 | 3/1995 |

(Continued)

OTHER PUBLICATIONS

Feb. 4, 2010 Office Action in U.S. Appl. No. 11/704,199.

(Continued)

*Primary Examiner* — Steven H Whitesell Gordon
*Assistant Examiner* — Mesfin T Asfaw

(57) ABSTRACT

There is disclosed an exposure method is a method of projecting patterns (M1, M2) of a mask (M) onto a substrate to effect exposure thereof, through a plurality of projection optical units each having an enlargement magnification, and the exposure method comprises: placing the mask (M) having first pattern regions (M1) arranged discontinuously in a positional relation corresponding to the enlargement magnification, and second pattern regions (M2) provided at least in part between the first pattern regions (M1), on the object plane side of the projection optical units; projecting enlarged images of either of the first pattern regions (M1) and the second pattern regions (M2) onto the substrate disposed on the image plane side of the projection optical units to effect exposure thereof; and then projecting enlarged images of the other pattern regions onto the substrate to effect exposure thereof.

31 Claims, 29 Drawing Sheets

(56) References Cited

U.S. PATENT DOCUMENTS

| | | | |
|---|---|---|---|
| 2005/0208391 A1* | 9/2005 | Mieher et al. | 430/5 |
| 2005/0219487 A1 | 10/2005 | Osakabe et al. | |
| 2007/0003878 A1 | 1/2007 | Paxton et al. | |
| 2007/0005878 A1 | 1/2007 | Regev et al. | |

FOREIGN PATENT DOCUMENTS

| | | |
|---|---|---|
| JP | A-08-250399 | 9/1996 |
| JP | A-11-265848 | 9/1999 |
| JP | A-2000-331909 | 11/2000 |
| JP | A-2001-168003 | 6/2001 |
| JP | A-2003-151880 | 5/2003 |
| JP | A-2004-122470 | 4/2004 |
| JP | A-2004-327660 | 11/2004 |
| JP | A-2004-335864 | 11/2004 |
| KR | 10-2001-0051835 | 6/2001 |
| TW | 512257 | 12/2002 |
| TW | 2005-19523 | 6/2005 |

OTHER PUBLICATIONS

Oct. 24, 2011 Search Report issued in EP Application No. 07713949.1.

International Preliminary Report on Patentability mailed Aug. 28, 2008 in International Application No. PCT/JP2007/052241.

Office Action issued in Chinese Patent Application No. 2007800035009 on Jan. 15, 2010 (with translation).

Jul. 16, 2010 Office Action issued in Chinese Application No. 200780003500.9 (with English translation).

Jun. 7, 2011 Office Action issued in Japanese Application No. 2006-279389 (with English translation).

May 1, 2007 Written Opinion issued in Application No. PCT/JP2007/052241 (with English translation).

May 1, 2007 International Search Report issued in Application No. PCT/JP2007/052241.

Sep. 30, 2010 Office Action issued in U.S. Appl. No. 11/704,199.

Dec. 12, 2011 Notice of Allowance issued in U.S. Appl. No. 11/704,199.

Jul. 16, 2013 Office Action issued in Chinese Application No. 201110265679.03 (with translation).

Jul. 24, 2013 Office Action issued in Taiwanese Application No. 096104755 (with translation).

Aug. 7, 2013 Office Action issued in Korean Application No. 10-2008-7013005 (with translation).

* cited by examiner

EXPOSURE METHOD, EXPOSURE APPARATUS, PHOTOMASK AND METHOD FOR MANUFACTURING PHOTOMASK

CROSS-REFERENCE TO RELATED APPLICATIONS

This is a Continuation of application Ser. No. 11/704,199 filed Feb. 9, 2007 (now U.S. Pat. No. 8,159,649) which claims the benefit of priorities from U.S. Provisional Application No. 60/853,451, filed on Oct. 23, 2006, Japanese Patent Application No. 2006-039372 filed on Feb. 16, 2006, and Japanese Patent Application No. 2006-279389 filed on Oct. 13, 2006, the entire contents of which are incorporated herein by reference.

BACKGROUND

1. Field

An embodiment of the present invention relates to an exposure method using an exposure apparatus for producing micro devices such as flat panel display devices, e.g., liquid-crystal display devices, an exposure apparatus for carrying out exposure by the exposure method, a photomask used in the exposure method, and a method of manufacturing the photomask.

2. Description of the Related Art

A projection exposure apparatus for projecting a pattern of a mask (reticle, photomask, or the like) through a projection optical system onto a plate (glass plate, semiconductor wafer, or the like) coated with a resist is used, for example, in production of semiconductor devices, liquid-crystal display devices, or the like. The projection exposure apparatus (steppers) have frequently been used heretofore to effect full-field exposure of a pattern of a reticle in each shot area on a plate by the step-and-repeat method. U.S. Pat. No. 5,729,331 discloses an exposure apparatus of the step-and-scan method having a plurality of partial projection optical units arranged in a direction perpendicular to a scanning direction and arranged at predetermined intervals and in plural rows along the scanning direction, instead of one large projection optical system, and effecting exposure of patterns of a mask on a plate by the respective partial projection optical units with scanning of the mask and plate and a plurality of partial projection optical units used are optical systems for effecting erected, normal image therein. Further, U.S. Pat. No. 6,512,573 discloses that the magnification of the projection optical units is 1.1× to 1.5× or more and is the enlargement magnification of 4× in examples.

SUMMARY

In the embodiment of the present invention, an exposure method capable of performing exposure while avoiding the increase in the size of the mask and increasing the utilization efficiency of the pattern region of the mask, an exposure apparatus for performing exposure by the exposure method, a photomask used in the exposure method, and a method of manufacturing the photomask.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

According to the embodiment of the present invention, the exposure is an exposure method of projecting a pattern on a first object onto a second object through a plurality of projection optical units each having an enlargement magnification, to effect exposure thereof, the exposure method comprising: a step of placing the first object, which has first pattern regions arranged discontinuously in a positional relation corresponding to the enlargement magnification, and second pattern regions provided at least in part between the first pattern regions, on a first surface side of the projection optical units; and projecting enlarged images of the first pattern regions out of the first pattern regions and the second pattern regions, through the respective projection optical units onto the second object placed on a second surface side of the projection optical units, to effect exposure thereof.

An another embodiment according to the present invention is an exposure apparatus for projecting a pattern on a first object onto a second object through a plurality of projection optical units each having an enlargement magnification, to effect exposure thereof, the exposure apparatus comprising: a first holding device for supporting the first object, which has first pattern regions provided on the first object and arranged discontinuously, and second pattern regions provided at least in part between the first pattern regions, on a first surface of the projection optical units; and a second holding device for holding the second object on a second surface of the projection optical units so as to project enlarged images of the first pattern regions out of the first pattern regions and the second pattern regions, through the respective projection optical units.

Further an another embodiment according to the present invention is a photomask having an original pattern formed for exposure of a pattern on a photosensitive object through a plurality of projection optical units having an enlargement magnification, the photomask comprising: a plurality of first pattern regions arranged discontinuously in a positional relation corresponding to the enlargement magnification, and used for forming enlarged images thereof through the respective projection optical units; and a second pattern region which is provided at least in part between the first pattern regions and an enlarged image of which is formed by at least one of the projection optical units.

Further an another embodiment according to the present invention is a photomask having pattern regions, wherein the pattern regions include odd-row pattern regions and even-row pattern regions, the photomask having common regions with an identical pattern, at edges of at least an adjacent pair of the odd-row pattern regions or the even-row pattern regions, and wherein the even-row pattern regions are arranged at least in part between at least an adjacent pair of the odd-row pattern regions.

Further an another embodiment according to the present invention is a method of manufacturing the above-described photomask, the method comprising: dividing pattern data corresponding to all odd-row patterns to be formed in the odd-row pattern regions on the photomask, to generate first divided data units; dividing pattern data corresponding to all even-row patterns to be formed in the even-row pattern regions on the photomask, to generate second divided data units; adding pattern data corresponding to the common regions, to edges of at least a pair of the first divided data units or at least a pair of the second divided data units, to generate odd-row pattern drawing data and even-row pattern drawing data, corresponding to all the patterns to be formed on the photomask; and drawing all the patterns on the photomask, using the odd-row pattern drawing data and the even-row pattern drawing data.

Further an another embodiment according to the present invention is a method of manufacturing the above-described photomask, the method comprising: dividing pattern data corresponding to all odd-row patterns having the common regions for at least a pair of the odd-row pattern regions, to generate first divided data units; dividing pattern data corresponding to all even-row patterns having the common regions for at least a pair of the even-row pattern regions, to generate second divided data units; and drawing all the odd-row patterns and all the even-row patterns on the photomask, using the first divided data units and the second divided data units.

Since the exposure method of the embodiment enables the projection exposure of the enlarged images of the patterns on the first object onto the second object through the plurality of projection optical units with the enlargement magnification, increase in the size of the first object can be prevented even with increase in the size of the second object. In addition, since the exposure method effects the projection exposure of the enlarged images of the first pattern regions arranged discontinuously in the positional relation corresponding to the enlargement magnification of the projection optical units or the enlarged images of the second pattern regions provided between the first pattern regions, onto the second object, it increases the utilization efficiency of the first object.

Since the exposure apparatus of the embodiment comprises the projection optical units with the enlargement magnification, it is able to project the enlarged images of the patterns provided on the first object, onto the second object. Therefore, increase in the size of the first object is prevented even with increase in the size of the second object and thus increase in the size of the first holding device is prevented. Since the exposure apparatus performs the projection exposure of the enlarged images of the first pattern regions arranged discontinuously in the positional relation corresponding to the enlargement magnification of the projection optical units, or the second pattern regions provided between the first pattern regions, onto the second object, it increases the utilization efficiency of the first object. Particularly, in the case of the exposure apparatus wherein a plurality of partial projection optical units are arranged in the direction perpendicular to the scanning direction and wherein scanning is performed in the scanning direction, a length of the mask in the scanning direction is reduced to a length of about 1/(enlargement magnification).

Since the photomask of the embodiment has the first pattern regions arranged discontinuously in the positional relation corresponding to the enlargement magnification of the projection optical units and used for forming the enlarged images by the respective projection optical units, and the second pattern region provided at least in part between the first pattern regions and used for forming the enlarged image thereof by at least one of the projection optical units, increase in the size thereof is prevented and the utilization efficiency of pattern regions is increased. Therefore, it becomes feasible to decrease the number of photomasks necessary for manufacturing of various devices by use of the exposure apparatus. For example, the conventional exposure process required a plurality of photomasks, whereas the present invention enables exposure even with a single photomask, which can reduce the time for replacement of photomasks and which realizes reduction in the cost of the photomask.

The manufacture method of the photomask according to the embodiment reduces the manufacture cost of the photomask.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
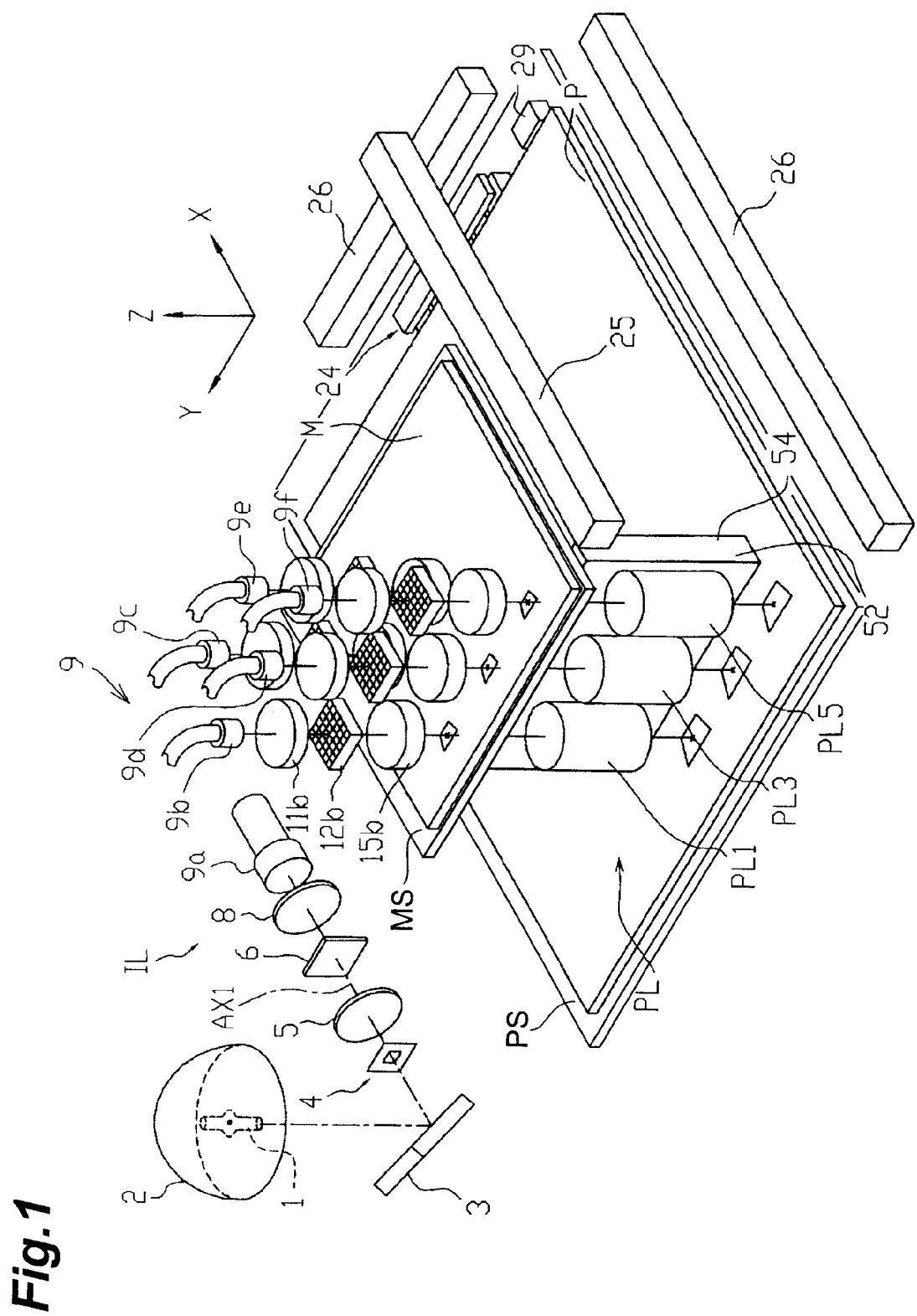
FIG. 1 is a perspective view showing a schematic configuration of an exposure apparatus according to an embodiment.

An exposure apparatus according to an embodiment of the present invention will be described below with reference to the drawings. FIG. 1 is a perspective view showing a schematic configuration of the exposure apparatus according to this embodiment. In the present embodiment, the description will be given using an example of the exposure apparatus of the step-and-scan method to transfer an image of a pattern (original pattern) formed on a mask M, onto a plate P while effecting relative movement of the mask (first object, photomask) M and the plate (second object, photosensitive object) P relative to a projection optical system PL consisting of catadioptric projection optical units PL1, PL3, PL5 and two unrepresented projection optical units (hereinafter referred to as projection optical units PL2, PL4).

In the description hereinafter, an XYZ orthogonal coordinate system is set as shown in each of the drawings, and positional relations of respective members will be described with reference to this XYZ orthogonal coordinate system. The XYZ orthogonal coordinate system is a system wherein the X-axis and Y-axis are set in parallel with the plate P and the Z-axis is set in a direction perpendicular to the plate P. The XYZ coordinate system in the drawings is set so that the XY plane is set as a plane parallel to the horizontal plane and the Z-axis is set along the vertically upward direction. In the present embodiment directions of movement of the mask M and plate P (scanning directions) are set along the X-axis direction.

The exposure apparatus of the present embodiment is provided with an illumination optical system IL for uniformly illuminating the mask M supported on a mask stage (first holding device) MS. The illumination optical system IL has a light source 1, for example, consisting of a mercury lamp or an ultrahigh pressure mercury lamp. Since the light source 1 is located at a first focus position of an ellipsoidal mirror 2, illumination beams emitted from the light source 1 are focused via a dichroic mirror 3 to form a light source image at a second focus position of the ellipsoidal mirror 2.

In the present embodiment, the light emitted from the light source 1 is reflected by a reflecting film formed on an inner surface of the ellipsoidal mirror 2 and by the dichroic mirror 3, whereby the light source image is formed at the second focus position of the ellipsoidal mirror 2 by the light in the wavelength region of not less than 300 nm including light of the g-line (436 nm), light of the h-line (405 nm), and light of the i-line (365 nm). Namely, components unnecessary for exposure, except for the wavelength region including the g-line, h-line, and i-line, are removed on the occasion of the reflection on the ellipsoidal mirror 2 and on the dichroic mirror 3.

A shutter 4 is located at the second focus position of the ellipsoidal mirror 2. A pulsed illumination beam is obtained by quickly varying the light quantity of the illumination beam passing through an aperture of the shutter 4 by opening and closing the shutter 4. A divergent beam from the light source image formed at the second focus position of the ellipsoidal mirror 2 is converted into a nearly parallel beam by a collimating lens 5 and the nearly parallel beam is incident to a wavelength-selective filter 6. The wavelength-selective filter 6 is an element for transmitting only the beam in the wavelength region including the g-line, h-line, and i-line. The light having passed through the wavelength-selective filter 6 travels through a relay lens 8 to be focused again. An entrance end 9a of light guide 9 is located near this focus position. The light guide 9 is, for example, a random light guide fiber composed of a random bundle of a large number of optical fibers, and has the entrance end 9a as many as the light source 1 (one entrance end in this embodiment), and exit ends as many as the projection optical units forming the projection optical system PL (five projection optical units in this embodiment), i.e., five exit ends 9b-9f. In this manner, the light incident to the entrance end 9a of the light guide 9 propagates in the interior thereof and thereafter is outputted as divided from the exit ends 9b-9f. If the light quantity is insufficient with only one light source 1, it is preferable to provide a plurality of light sources, and to provide the light guide having a plurality of entrance ends corresponding to the respective light sources and adapted to divide incident light from each entrance end into beams of approximately identical light quantities and to output the light beams from the respective exit ends.

Between the exit end 9b of the light guide 9 and the mask M, there are a collimating lens 11b, a fly's eye integrator 12b, an aperture stop (not shown), a beam splitter (not shown), and a condenser lens system 15b arranged in the order named. Similarly, between each of the other four exit ends 9c-9f of the light guide 9 and the mask M, there are a collimating lens, a fly's eye integrator, an aperture stop (not shown), a beam splitter (not shown), and a condenser lens system arranged in the order named.

For simplification of the description, the configurations of the optical members disposed between each exit end 9b-9f of the light guide 9 and the mask M will be described using a representative example of the collimating lens 11b, fly's eye integrator 12b, and condenser lens system 15b disposed between the exit end 9b of the light guide 9 and the mask M.

The divergent beam emerging from the exit end 9b of the light guide 9 is converted into a nearly parallel beam by the collimating lens 11b and thereafter the nearly parallel beam is incident to the fly's eye integrator 12b. The fly's eye integrator 12b is composed of an array of a large number of lens elements arranged vertically and horizontally and densely so that the center axis thereof extends along the optical axis of the illumination optical system IL. Therefore, the beam incident to the fly's eye integrator 12b is subjected to wavefront splitting by the large number of lens elements, to form a secondary light source consisting of light source images as many as the lens elements, on a rear focal plane thereof (i.e., near the exit plane). Namely, a substantial surface illuminant is formed on the rear focal plane of the fly's eye integrator 12b.

A number of beams from the secondary light source formed on the rear focal plane of the fly's eye integrator 12b are limited by the unrepresented aperture stop located near the rear focal plane of the fly's eye integrator 12b, and the limited beams travel through the unrepresented beam splitter to enter the condenser lens system 15b. The aperture stop is located at a position approximately optically conjugate with the pupil plane of the corresponding projection optical unit PL1 and has a variable aperture for defining the range of the secondary light source contributing to illumination. The aperture stop varies the aperture diameter of the variable aperture to set the σ-value (a ratio of an aperture diameter of the secondary light source image on the pupil plane to an aperture diameter of the pupil plane of each projection optical unit PL1-PL5 forming the projection optical system PL), which determines the illumination condition, to a desired value.

The beams having passed through the condenser lens system 15b illuminate the mask M in a superposed manner. The divergent beams emerging from the other four exit ends 9c-9f of the light guide 9 also travel similarly through the collimating lens, fly's eye integrator, aperture stop, beam splitter, and condenser lens in order to illuminate the mask M in a superposed manner. Namely, the illumination optical system IL illuminates a plurality of trapezoidal regions (five regions in this embodiment) arranged in the Y-axis direction on the mask M. The light source in the illumination optical system IL may be another light source such as a UV conductor laser (h-line), a solid-state laser (355 nm), a KrF excimer laser, or an ArF excimer laser.

Figure 2:
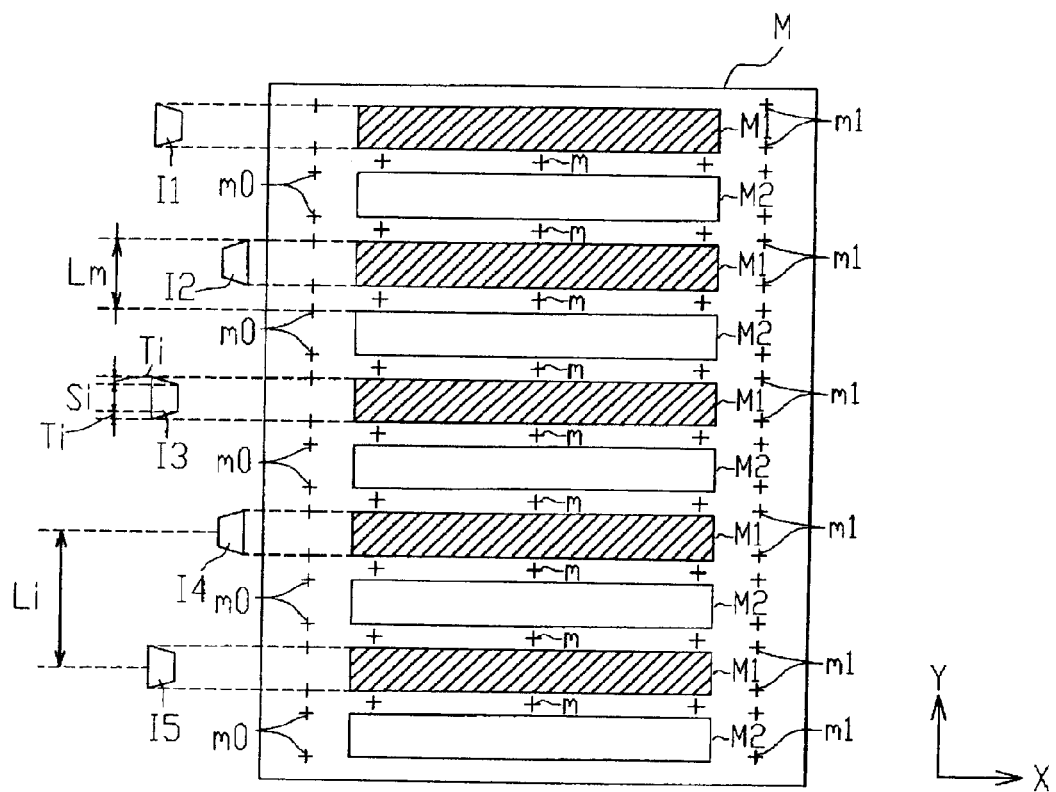
FIG. 2 is a drawing showing a configuration of a mask according to the embodiment.

FIG. 2 is a drawing showing a configuration of the mask M. As shown in FIG. 2, first patterns (first pattern regions) M1 (hatched regions in the drawing) used in first exposure and second patterns (second pattern regions) M2 used in second exposure are formed on the mask M. The first patterns M1 and the second patterns M2 are formed each to correspond to five trapezoidal illumination regions I1-I5 under illumination on the mask M. Namely, the first patterns M1 are arranged discontinuously in a positional relation corresponding to an enlargement magnification of the projection optical system PL and a pitch distance Lr of exposure regions, which will be described later, and the second patterns M2 are provided between the first patterns M1 in a positional relation corresponding to the enlargement magnification of the projection optical system PL and the pitch distance Lr of exposure regions similarly to the first patterns M1. The first patterns M1 and the second patterns M2 arranged discontinuously are formed so that upon exposure on the plate P through the plurality of projection optical units PL1-PL5, the exposure regions have partially overlapping regions and form continuous patterns on the plate P.

The illumination regions I1-I5 are illuminated as arranged at a predetermined pitch distance Li, each illumination region I1-I5 consists of a portion of width Si and portions of width Ti, and, when they are projected through the projection optical system PL, overlap portions of illumination regions are formed with the portions of width Si being adjacent to each other on the plate P. In the present embodiment, an effective illumination width resulting from averaging of the Y-directional widths of the illumination regions is obtained as (Ti+(Ti+Si×2))÷2=(Ti+Si), and a value resulting from multiplication of this effective illumination width (Ti+Si) by the magnification of the projection optical system PL becomes equal to the pitch distance Lr of the exposure regions (cf. FIG. 3). The patterns of the mask are arranged at intervals of a pattern pitch Lm, where Lm is a distance of Li/2.

Since the respective pattern regions of the first patterns M1 and the respective pattern regions of the second patterns M2 are formed in one mask, a positional error of each pattern region is kept small. Furthermore, a positional error is also small between the first patterns M1 and the second patterns M2, and a switching operation can be accurately performed in switching of exposed patterns. It also becomes feasible to implement stable offset adjustment on the occasion of imposing a position offset on each pattern.

A plurality of position measurement marks (second pattern regions, or patterns for detection of position) m, m0, m1 are formed on the −X-directional side, on the +X-directional side, and between the first patterns M1 and the second patterns M2 on the mask M. The position measurement marks m, m0, m1 are used for measuring aerial images formed above the plate P, by an after-described aerial image measuring device 24. Namely, the aerial image measuring device 24 measures aerial images of the position measurement marks m, m0, m1 formed by at least one of the projection optical units PL1-PL5, and positions of the images of the position measurement marks m, m0, m1 are detected based on the measurement result.

Light from each illumination region on the mask M is incident to the projection optical system PL consisting of a plurality of projection optical units PL1-PL5 (five projection optical units in this embodiment) arranged in a zigzag fashion along the Y-axis direction so as to correspond to the respective illumination regions. The light having passed through the projection optical system PL forms images of the patterns of the mask M on the plate P supported in parallel with the XY plane through a plate holder PS on a plate stage (second holding member) PS. Each of the projection optical units PL1-PL5 has a projection magnification larger than 2× (an enlargement magnification of 2.4× in the present embodiment). Therefore, enlarged images of the patterns of the mask M are formed in trapezoidal exposure regions R1-R5 arranged in the Y-direction so as to correspond to the respective illumination regions I1-I5, on the plate P. Namely, since the enlargement magnification of the projection optical units PL1-PL5 is 2.4, a field area of the exposure regions R1-R5 formed on the plate P is 2.4 times that of the illumination regions I1-I5 formed on the mask M. Each projection optical unit PL1-PL5 has an adjusting mechanism for adjusting the position of the image formed on the plate P, the magnification, rotation, focus, inclination of the image plane, and so on. For example, it has pair glasses of wedge shape for adjustment of focus and inclination of the image plane, a plane-parallel plate for adjustment of the position of the image, concave, convex, and concave magnification-adjustment lenses for adjustment of the magnification of the image, a prism mirror for adjustment of rotation of the image, and so on. Each projection optical unit PL1-PL5 is preferably telecentric on the plate P side though it depends upon flatness of the surface of the plate P.

Figure 3:
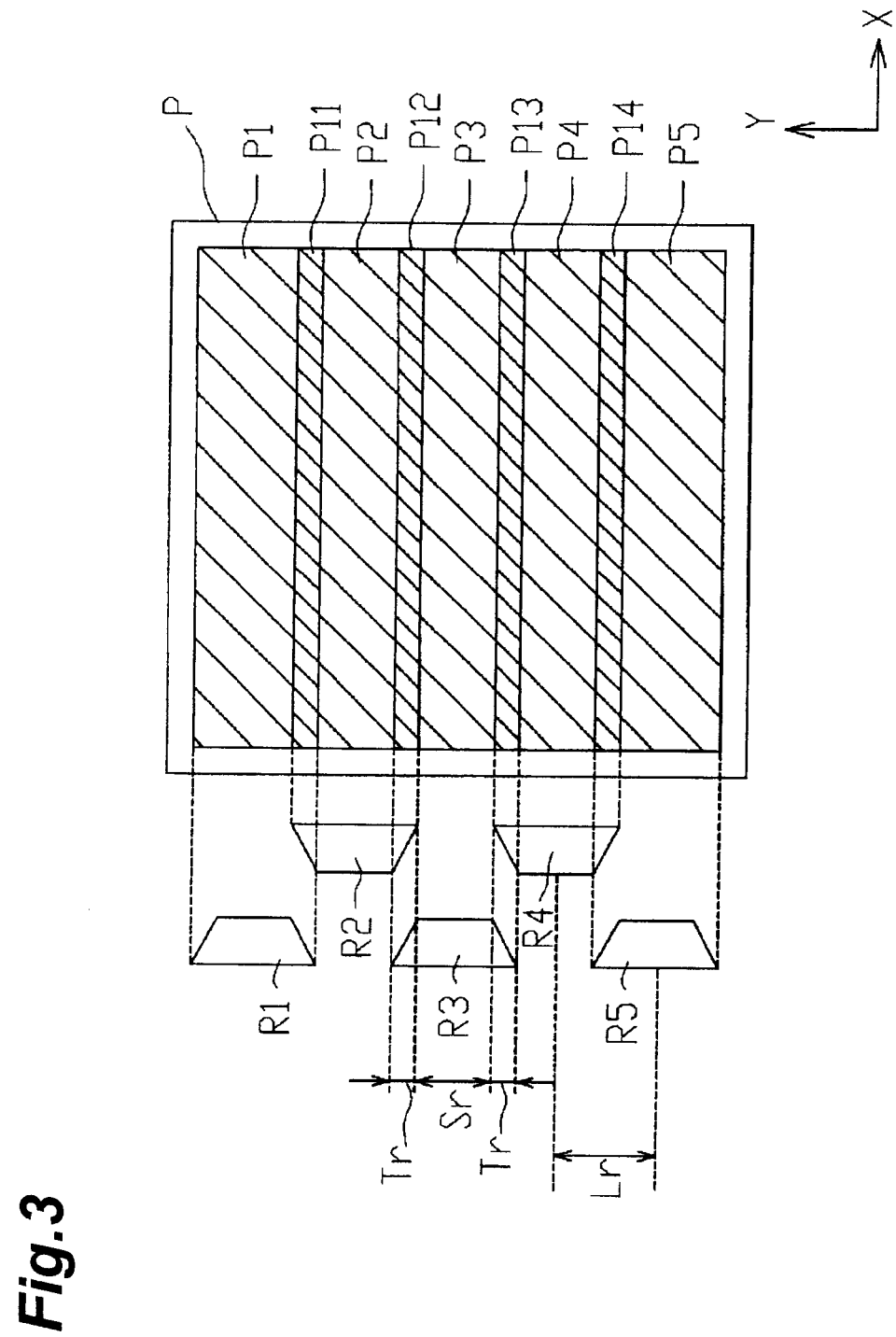
FIG. 3 is a drawing showing a configuration of a plate according to the embodiment.

FIG. 3 is a drawing showing a state in which the pattern images of the mask M are formed on the plate P. As shown in FIG. 3, the exposure region R1 corresponding to the illumination region I1 achieves exposure of the first pattern M1 or the second pattern M2 on the mask M, on a region P1 on the plate P. Similarly, the exposure regions R2-R5 corresponding to the illumination regions I2-I5 achieve exposure of the first patterns M1 or the second patterns M2 on the mask M, on respective regions P2-P5 on the plate P. Namely, a switching mechanism is arranged to selectively switch the first patterns M1 and the second patterns M2 so as to effect the projection exposure of the enlarged images of the first patterns M1 or the second patterns M2 on the plate P, a mask stage MS is subjected to step movement by a predetermined distance in the Y-direction by the switching mechanism, and the enlarged images of the first patterns M1 or the second patterns M2 illuminated by the illumination optical system IL are projected onto the respective regions P1-P5 on the plate P to effect exposure thereof. In the present embodiment, the predetermined distance in the step movement is approximately the pitch distance of the projection optical units PL1-PL5.

Each exposure region R1-R5 consists of a portion of width Sr and portions of width Tr, and the exposure regions R1-R5 become overlap portions of exposure regions wherein the portions of width Sr are adjacent to each other on the plate P. In the present embodiment, the Y-directional width of each exposure region consists of the portion of width Sr and the portions of width Tr resulting from multiplication of the portion of width Si and the portions of width Ti shown in FIG. 2, by the magnification of the projection optical system, and an effective exposure width resulting from averaging of the Y-directional widths of the exposure regions is given by (Tr+Sr) and is equal to the pitch distance Lr of the exposure regions. Therefore, when the pitch distance Lr of the exposure regions is the same as the Y-directional array pitch of the projection optical units, the pattern pitch Lm of the patterns of the mask is determined once the pitch distance Lr of the exposure regions and the magnification are set.

Connection portions of the first patterns M1 or the second patterns M2 of the mask M are patterned, for example, at random or in a zigzag fashion so as to make continuous a pattern of a connection (overlay portion or overlap portion) P11 of the exposure regions R1 and R2 formed by the projection optical units PL1, PL2, and patterns of connections (overlay portions or overlap portions) P12-P14 of the exposure regions R2-R5 formed by the projection optical units PL2-PL5. The exposure regions are not limited to the trapezoidal shape, but may be any shape determined by the optical systems constituting the apparatus, e.g., rectangle, hexagon, arc, arc+triangle, or the like.

The mask stage (first holding member) MS supporting the mask M on the object side (first surface) of the projection optical system PL is provided with a scanning drive system (not shown) having a long stroke for movement of the mask stage along the X-axis direction being the scanning direction. It is also provided with a pair of alignment drive systems (not shown) for moving the mask stage by a predetermined distance along the Y-axis direction being the direction orthogonal to the scanning direction and for rotating the mask stage by a small angle around the Z-axis. A laser interferometer (not shown) using a moving mirror 25 measures coordinates of the position of the mask stage and the position of the mask stage is controlled based on the result of the measurement. Furthermore, the mask stage is arranged so that its Z-directional position is variable.

A plate stage (second holding device) PS holding the plate P on the image side (second surface) of the projection optical system PL is also provided with similar drive systems. Namely, the plate stage is provided with a scanning drive system (not shown) having a long stroke for movement of the plate stage along the X-axis direction being the scanning direction, and with a pair of alignment drive systems (not shown) for moving the plate stage by a predetermined distance along the Y-axis direction being the direction perpendicular to the scanning direction and for rotating the plate stage by a small angle around the Z-axis. A laser interferometer (not shown) using a moving mirror 26 measures coordinates of the position of the plate stage and the position is controlled based thereon. The plate stage is also arranged to be movable in the Z-direction as the mask stage is. In the present embodiment, the patterns of the mask M are enlarged at the ratio of 2.4 by the projection optical system PL to be projected onto the plate P. Therefore, the mask stage and the plate stage are moved at a scanning ratio of 1:2.4 to effect scanning of each stage relative to the projection optical system PL. Namely, the plate stage is moved at a magnification-fold speed ratio relative to the mask stage, according to the magnification of the projection optical system PL. This results in effecting the exposure onto the plate P side while the length in the scanning direction is enlarged to the magnification times the length of the pattern regions of the mask M.

The projection optical units PL1, PL3, PL5 are arranged as a first row at predetermined intervals in the direction perpendicular to the scanning direction. The projection optical units PL2, PL4 are also arranged similarly as a second row at a predetermined interval in the direction perpendicular to the scanning direction. An off-axis alignment system 52 for positioning of the plate P and an autofocus system 54 for adjustment of the focus position of the mask M and the plate P are arranged between the projection optical unit group of the first row and the projection optical unit group of the second row.

In addition, an illuminance measuring section 29 for measuring the illuminance of light projected through the projection optical system PL onto the plate P is provided on the plate stage. Furthermore, the aerial image measuring device (detecting mechanism) 24 for measuring aerial images of the position measurement marks m, m0, m1 formed by at least one of the projection optical units PL1-PL5 is provided on the plate stage.

Figure 4:
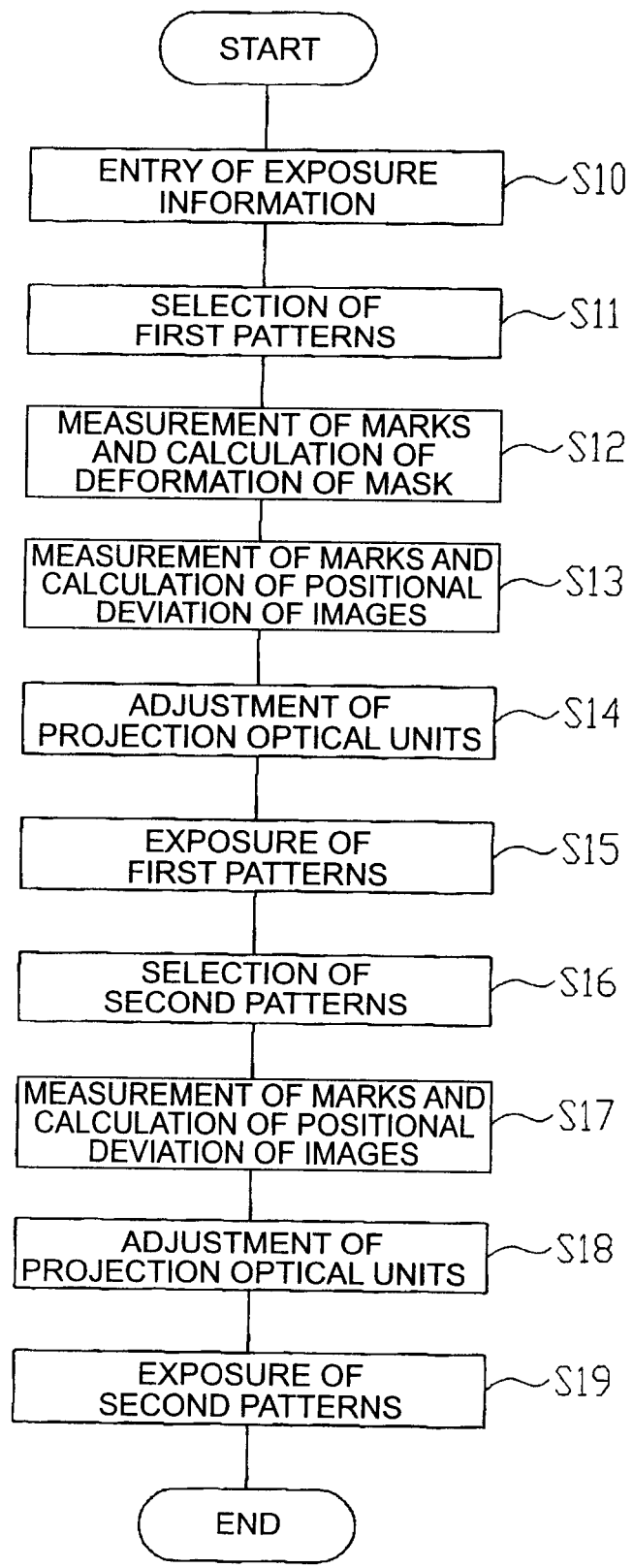
FIG. 4 is a flowchart for explaining an exposure method according to the embodiment.

An exposure method using the exposure apparatus according to the present embodiment will be described below with reference to the flowchart shown in FIG. 4.

The first block is to enter exposure information for selection of the first patterns M1 and the second patterns M2 formed on the mask M (block S10). In this embodiment, the exposure information to be entered is positions of exposure regions on the plate P to be exposed to the first patterns M1, positions of exposure regions on the plate P to be exposed to the second patterns M2, and so on. The exposure information may be preliminarily entered. Another applicable configuration is such that the mask M is provided with an ID such as a bar code for identification including the exposure information and a bar code reader or the like retrieves the exposure information. The next block is to select the first patterns M1 or the second patterns M2, based on the exposure information entered in the block S10 (block S11). It is assumed in this embodiment that the first patterns M1 are selected.

The next block is to measure the aerial images of the position measurement marks m formed between the first patterns M1 and the second patterns M2 of the mask M by means of the aerial image measuring device 24 (block S12). Specifically, the mask stage supporting the mask M is moved by a predetermined distance in the Y-direction, whereby the mask stage is located so that the position measurement marks m formed between the first patterns M1 and the second patterns M2 are positioned in the illumination regions I1-I5 during X-directional scanning of the mask stage. At the same time as the movement of the mask stage, the plate stage is moved by a predetermined distance to locate the plate stage at a position where the aerial image measuring device 24 can measure the aerial images of the position measurement marks m. Then the mask stage is stepped by a predetermined distance in the X-direction (scanning direction) and this is repeated to sequentially measure the aerial images of the position measurement marks m formed between the first patterns M1 and the second patterns M2. An amount of deformation of the mask M is calculated based on the result of the measurement of the position measurement marks m.

In the present embodiment, the position measurement marks m are provided between the first patterns M1 and the second patterns M2 on the mask M, and these position measurement marks m can be measured by the aerial image measuring device 24; therefore, deformation can be highly accurately detected across the entire surface of the mask M. The deformation includes deflection upon mounting of the mask M on the mask stage, and expansion and contraction due to heat. Generally, in the case of the mask where the position measurement marks m are drawn simultaneously with the first patterns M1 and the second patterns M2, it becomes feasible to detect a drawing error of the regions of the first patterns M1 and a drawing error of the regions of the second patterns M2, by measuring the position measurement marks m formed between the first patterns M1 and the second patterns M2. Furthermore, using the information, a compensation for the positions of the enlarged images, or adjustment of the magnification or the like can also be performed by the adjusting mechanisms provided for the projection optical units PL1-PL5.

The next block is to measure the aerial images of the position measurement marks m0 formed on the −X-directional side on the mask M, by means of the aerial image measuring device 24, in order to detect a relative positional deviation (connection error) of the images of the first patterns M1 formed by the respective projection optical units PL1-PL5 (block S13). First, relative movement is effected between the mask stage (mask M) and the projection optical units PL1-PL5 so as to oppose the first patterns M1 to the projection optical units PL1-PL5. Specifically, the mask stage is stepped by a predetermined distance in the Y-direction so that the first patterns M1 are illuminated by the illumination optical system IL, i.e., so that the first patterns M1 are located in the illumination regions I1-I5. The plate stage is moved by a predetermined distance at the same time of the movement of the mask stage, whereby the plate stage is located at the position where the aerial image measuring device 24 can measure the aerial images of the position measurement marks m0. Then the aerial images of the position measurement marks m0 formed on the −X-directional side on the mask M are measured. An amount of relative positional deviation (connection error) of the images of the first patterns M1 formed by the respective projection optical units PL1-PL5 is calculated based on the result of the measurement of the position measurement marks m0.

The next block is to perform adjustment of each projection optical unit PL1-PL5, based on the relative positional deviation amount of the images of the first patterns M1 formed by the respective projection optical units PL1-PL5, calculated in the block S13 (block S14). Namely, a correction amount of the adjusting mechanism of each projection optical unit PL1-PL5 is calculated based on the relative positional deviation amount. Then the adjusting mechanism of each projection optical unit PL1-PL5 is driven based on the calculated correction amount of the adjusting mechanism to adjust the position of the image projected by each projection optical unit PL1-PL5.

The next block is to perform exposure of the first patterns M1 while driving the adjusting mechanisms of the respective projection optical units PL1-PL5, based on the correction amounts of the adjusting mechanisms of the respective projection optical units PL1-PL5 based on the deformation amount of the mask M calculated in the block S12 (block S15). Namely, the enlarged images of the first patterns M1 arranged discontinuously in the Y-direction (predetermined direction) are projected through the projection optical units PL1-PL5 onto the plate P to effect exposure thereof, and scanning exposure is implemented by performing relative scanning in the X-direction (in the direction intersecting with the predetermined direction) of the mask stage (mask M) and the plate stage (plate P) relative to the projection optical units PL1-PL5.

On this occasion, the mask stage and the plate stage are moved at the ratio of the projection magnification of the projection optical units PL1-PL5 in the X-directions because the projection optical units PL1-PL5 have the enlargement magnification. Namely, since the projection magnification of the projection optical units PL1-PL5 is 2.4× in the present embodiment, the scanning speed of the plate stage is 2.4 times the scanning speed of the mask stage. As shown in FIG. 3, the enlarged images P1-P5 of the first patterns M1 are projected onto the plate P so as to be continuously formed together with regions P11-P14 as overlap exposure regions.

The next block is to select the first patterns M1 or the second patterns M2, based on the exposure information entered in the block S10 (block S16). In the present embodiment, the second patterns M2 are selected.

The next block is to measure the aerial images of the position measurement marks m0 formed on the −X-directional side on the mask M, by means of the aerial image measuring device 24, in order to detect relative positional deviation (connection error) of the images of the second patterns M2 formed by the respective projection optical units PL1-PL5 (block S17). First, relative movement is effected between the mask stage (mask M) and the projection optical units PL1-PL5 so as to oppose the second patterns M2 to the projection optical units PL1-PL5. Specifically, the mask stage is stepped by a predetermined distance in the Y-direction so that the second patterns M2 are illuminated by the illumination optical system IL, i.e., so that the second patterns M2 are located in the illumination regions I1-I5. The plate stage is moved by a predetermined distance at the same time as the movement of the mask stage, whereby the plate stage is located at the position where the aerial image measuring device 24 can measure the aerial images of the position measurement marks m0. Then the aerial image measuring device 24 measures the aerial images of the position measurement marks m0 formed on the −X-directional side on the mask M. An amount of relative positional deviation (connection error) of the images of the second patterns M2 formed by the respective projection optical units PL1-PL5 is calculated based on the result of the measurement of the position measurement marks m0.

The next block is to perform adjustment of each projection optical unit PL1-PL5, based on the relative positional deviation amount of the images of the second patterns M2 formed by the respective projection optical units PL1-PL5, calculated in the block S17 (block S18). Namely, a correction amount of the adjusting mechanism of each projection optical unit PL1-PL5 is calculated based on the relative positional deviation amount and the adjusting mechanism of each projection optical units PL1-PL5 is driven based on the calculated correction amount of the adjusting mechanism to adjust the position of the image projected by each projection optical unit PL1-PL5.

The next block is to perform exposure of the second patterns M2 (block S19). The exposure of the second patterns M2 is carried out while driving the adjusting mechanisms of the respective projection optical units PL1-PL5, based on the correction amounts of the adjusting mechanisms of the respective projection optical units PL1-PL5 based on the deformation amount of the mask M calculated in block S12. Namely, the enlarged images of the second patterns M2 arranged discontinuously in the Y-direction (predetermined direction) are projected through the projection optical units PL1-PL5 onto the plate P to effect exposure thereof, and scanning exposure is implemented by effecting relative scanning in the X-direction (the direction intersecting with the predetermined direction) of the mask stage (mask M) and the plate stage (plate P) relative to the projection optical units PL1-PL5.

Just as in the case of the exposure of the first patterns M1 in the block S15, the mask stage and the plate stage are moved at the ratio of the projection magnification of the projection optical units PL1-PL5 in the X-direction, and the enlarged images P1-P5 of the second patterns M2 are projected onto the plate P so as to be continuously formed together with regions P11-P14 as overlap exposure regions.

The block S13 and block 17 are arranged to measure the aerial images of the position measurement marks m0 formed on the −X-directional side on the mask M, but they may also be arranged to measure the aerial images of the position measurement marks m0, m1 formed on the −X-directional side and on the +X-directional side on the mask M. In this case, using the result of this measurement, the adjusting mechanisms of the respective projection optical units PL1-PL5 are driven before the exposure or during the exposure to correct for the relative positional deviation amounts of the images formed by the respective projection optical units PL1-PL5. When compared with the case where only the position measurement marks m0 formed on the −X-directional side on the mask M are measured, the relative positional deviations of the images formed by the respective projection optical units PL1-PL5 can be measured with higher accuracy because the position measurement marks m0, m1 formed on the two sides of the −X-directional side and the +X-directional side on the mask M are measured.

The present embodiment is described using the example of the mask M in which the first patterns M1 and the second patterns M2 for projection exposure in different exposure regions on the same plate P are formed, but different patterns for projection exposure on different plates may also be formed as the first patterns M1 and the second patterns M2 on the mask M. It is also possible to form patterns of the first layer as the first patterns M1 and patterns of the second layer as the second patterns M2 on the mask M. In these cases, efficient exposure can be performed with a reduced number of mask replacement.

Since the exposure apparatus and exposure method according to the present embodiment are able to effect the projection exposure of the enlarged images of the patterns provided on the mask M, onto the plate P through the plurality of projection optical units PL1-PL5 having the enlarged magnification, it is feasible to prevent increase in the size of the mask M relative to the plate P. Since the exposure apparatus and exposure method of the present embodiment are arranged so that the mask M has the first patterns M1 arranged discontinuously in the positional relation corresponding to the enlargement magnification of the plurality of projection optical units PL1-PL5, and the second patterns M2 or the position detection marks m provided at least in part between the first patterns M1 and so that the enlarged images of the first patterns M1 or the second patterns M2 are projected onto the plate P to effect exposure thereof, the utilization efficiency of the mask M can be increased.

Figure 5:
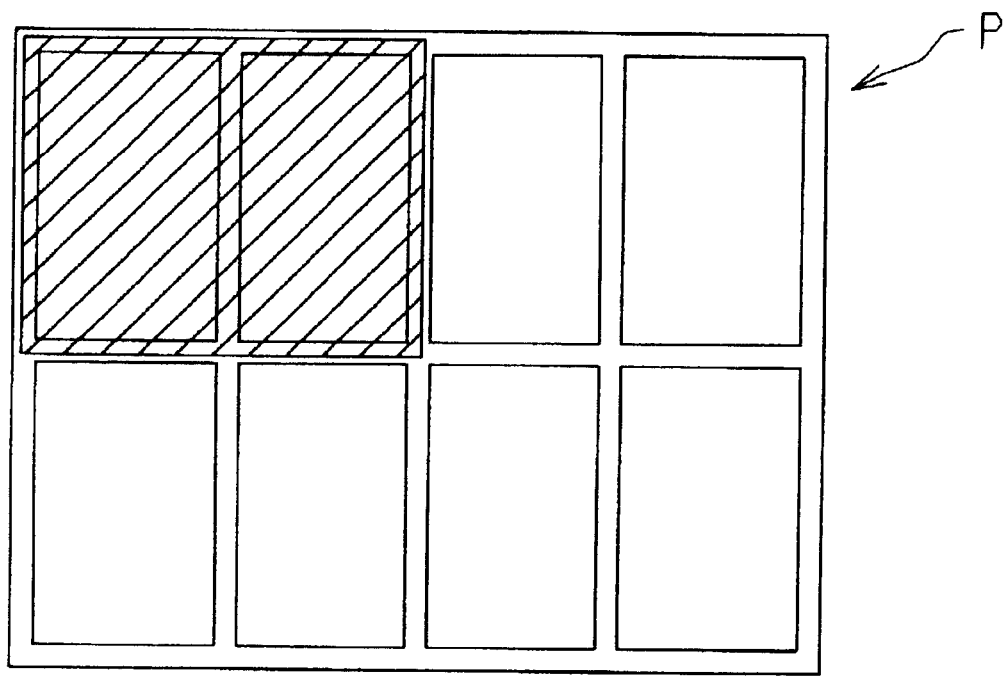
FIG. 5 is a drawing for explaining a case of exposure in which device patterns for eight panels are projected onto a plate.
Figure 6:
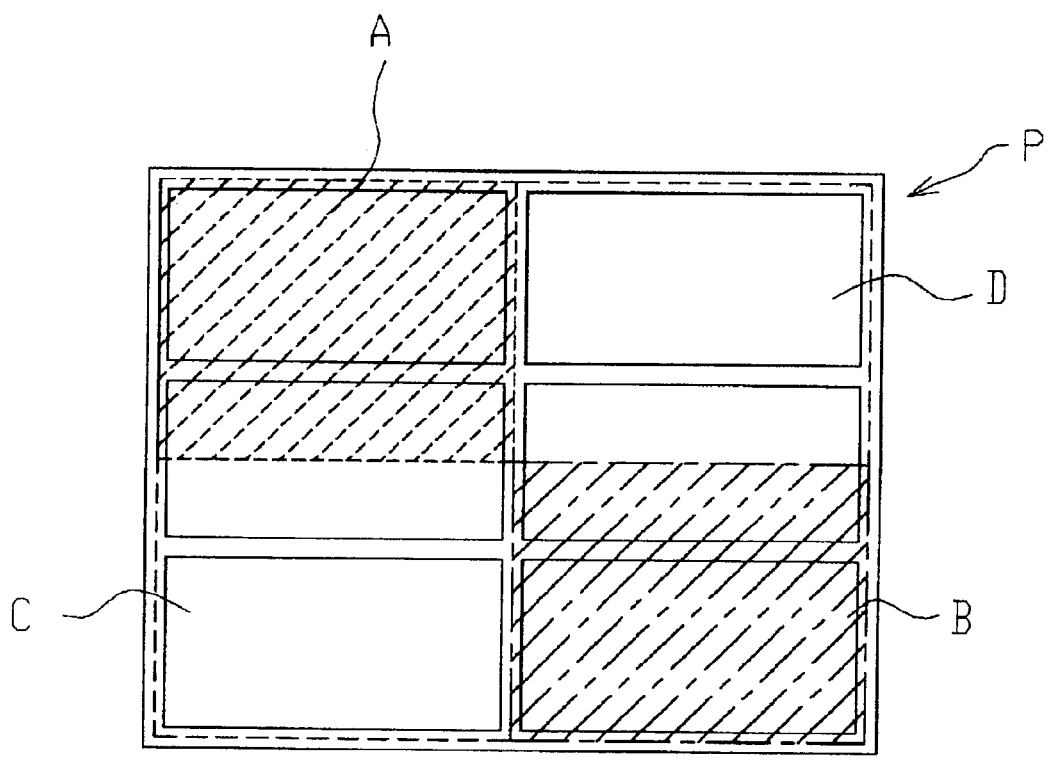
FIG. 6 is a drawing for explaining a case of exposure in which device patterns for six panels are projected onto a plate.

For example, let us explain a case where ordinary exposure of liquid-crystal devices involves exposure of device patterns of eight panels on a plate P as shown in FIG. 5 and exposure of device patterns of six panels on a plate P as shown in FIG. 6. Normally, a liquid-crystal panel is made through blocks of sputtering, resist application, exposure, development, and etching for 4-5 layers. On the assumption that there are five layers, five masks (photomasks) are necessary. Since five masks are needed for each of the 8-panel exposure case shown in FIG. 5 and the 6-panel exposure case shown in FIG. 6, a total of ten masks are needed. Since the cost of masks is high, a burden is heavy in terms of cost for manufacture of the ten masks.

It is assumed herein that the projection magnification of the projection optical system PL is not less than 2 as in the exposure apparatus of the above embodiment. For example, as shown in FIG. 2, the patterns for the 8-panel exposure block are drawn in the regions of the first patterns M1 on the mask M and the patterns for the 6-panel exposure block are drawn in the regions of the second patterns M2; this can reduce the number of masks necessary for the two types of exposure blocks of the 8-panel and 6-panel exposures to 5, which is half of the number of masks in the conventional technology.

Figure 7:
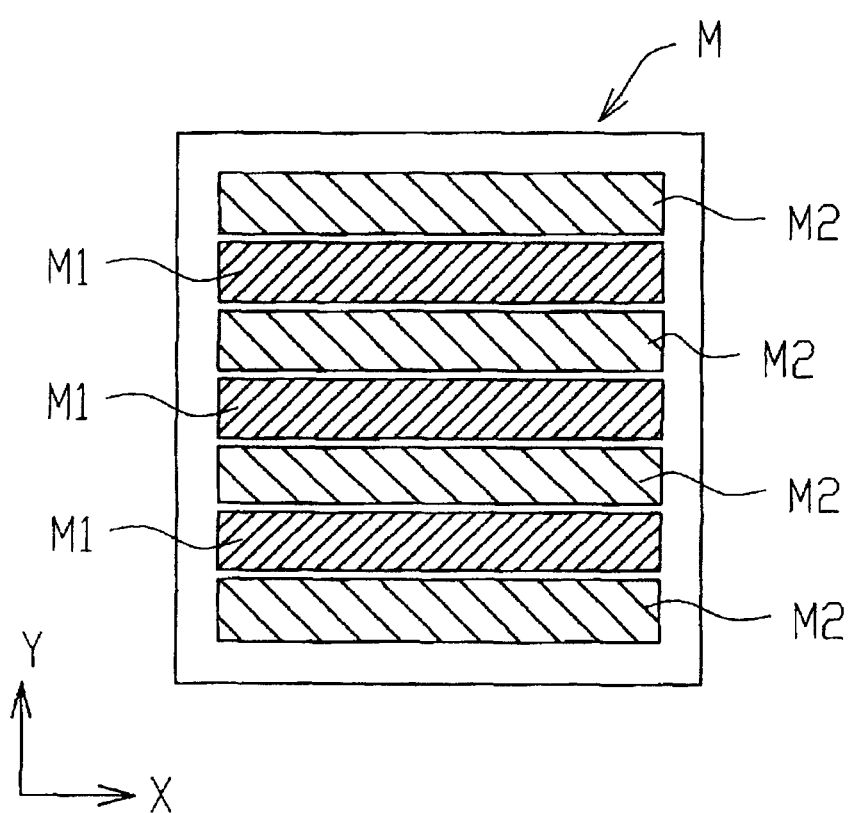
FIG. 7 is a drawing showing a configuration of another mask according to the embodiment.
Figure 8:
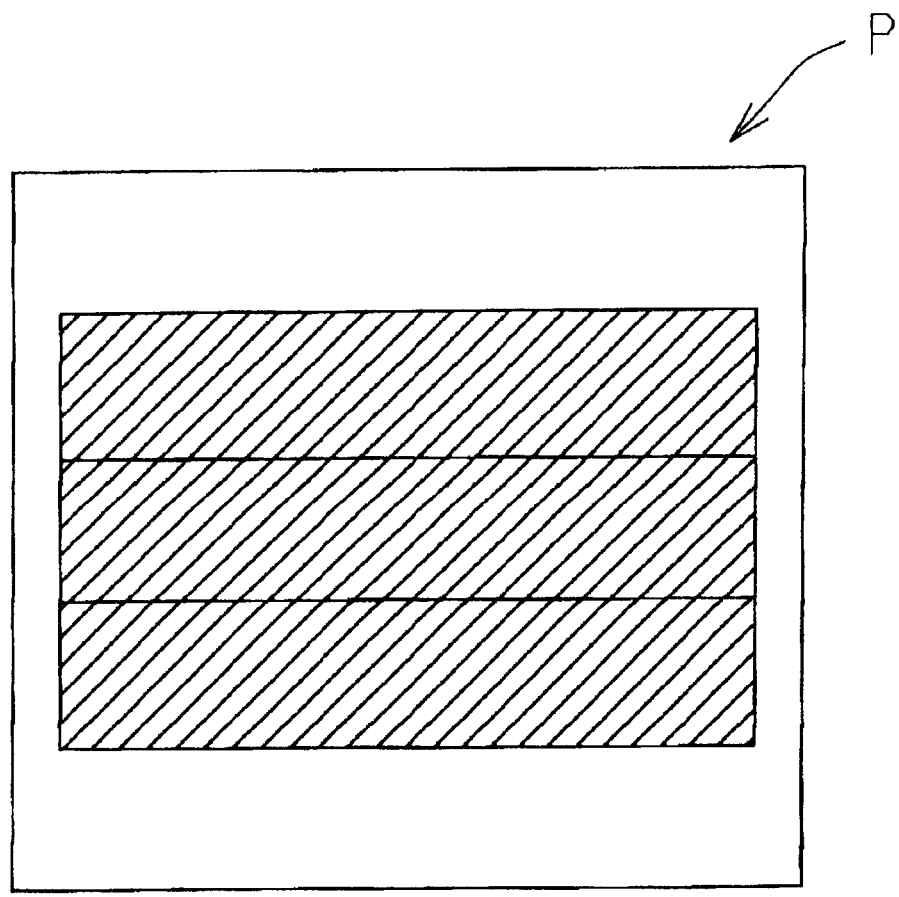
FIG. 8 is a drawing showing a configuration of another plate according to the embodiment.
Figure 9:
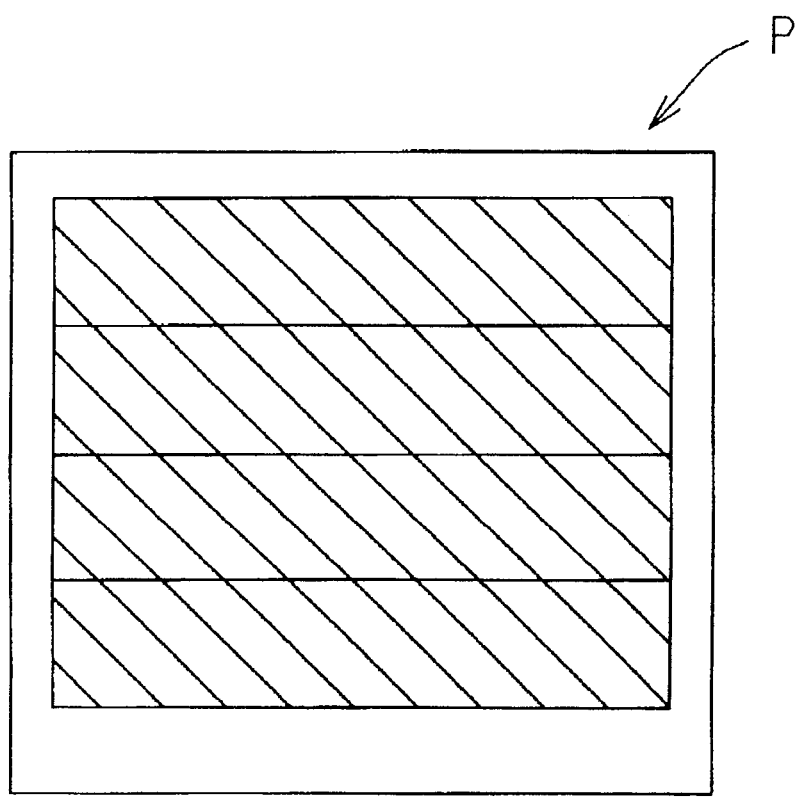
FIG. 9 is a drawing showing a configuration of another plate according to the embodiment.

Normally, the exposure is performed by four scans in the case of 8-panel exposure, and the exposure is performed by six scans in the case of 6-panel exposure. A pattern region (a region of one panel) in the 6-panel exposure case with 6 scans is smaller than that (hatched region in FIG. 5) in the 8-panel exposure case with 4 scans. Therefore, the regions of the first patterns M1 and the regions of the second patterns M2 on the mask M are distributed as shown in FIG. 7, to allocate three first patterns M1 arranged discontinuously, as patterns for 6-panel exposure and to allocate four second patterns M2 arranged discontinuously, as patterns for 8-panel exposure. In this case, the first patterns M1 are projected as shown in FIG. 8, and the second patterns M2 are projected as shown in FIG. 9, on the plate P; therefore, the 6-panel pattern regions and the 8-panel pattern regions of different sizes can be formed on the single mask, which increases the efficiency of use of the pattern regions of the mask.

For example, in the case of the conventional 6-panel exposure devices, a pattern of a region corresponding to one panel was drawn on the mask, whereas a potential method in the embodiment is such that a pattern of region A indicated by a dashed line in FIG. 6 is drawn as the first patterns M1 on the mask M and a pattern of region B indicated by a chain line in FIG. 6 is drawn as the second patterns M2 on the mask M. Connection exposure is performed so as to combine the region A and the region B on the plate P, whereby the exposure can be completed by four scans, instead of six scans, so as to improve the throughput.

The exposure operation in this case will be described below. First, the first patterns M1 of the mask M are projected into the region A on the plate P (cf. FIG. 6) and then the plate stage (plate P) is stepped by a predetermined distance in the Y-direction. On this occasion, the mask stage (mask M) is stepped by a predetermined distance in the Y-direction to switch the first patterns M1 to the second patterns M2. Then the second patterns M2 are projected into a region C (cf. FIG. 6) in a dashed line of the plate P. Similarly, the first patterns M1 are projected into a region D (cf. FIG. 6) and the second patterns M2 into the region B (cf. FIG. 6). Since the step movement of the mask stage (mask M) for switching between the first pattern M1 and the second pattern M2 can be implemented during the Y-directional step movement of the plate stage (plate P), the 4-scan exposures can be performed without delay of throughput.

Figure 10:
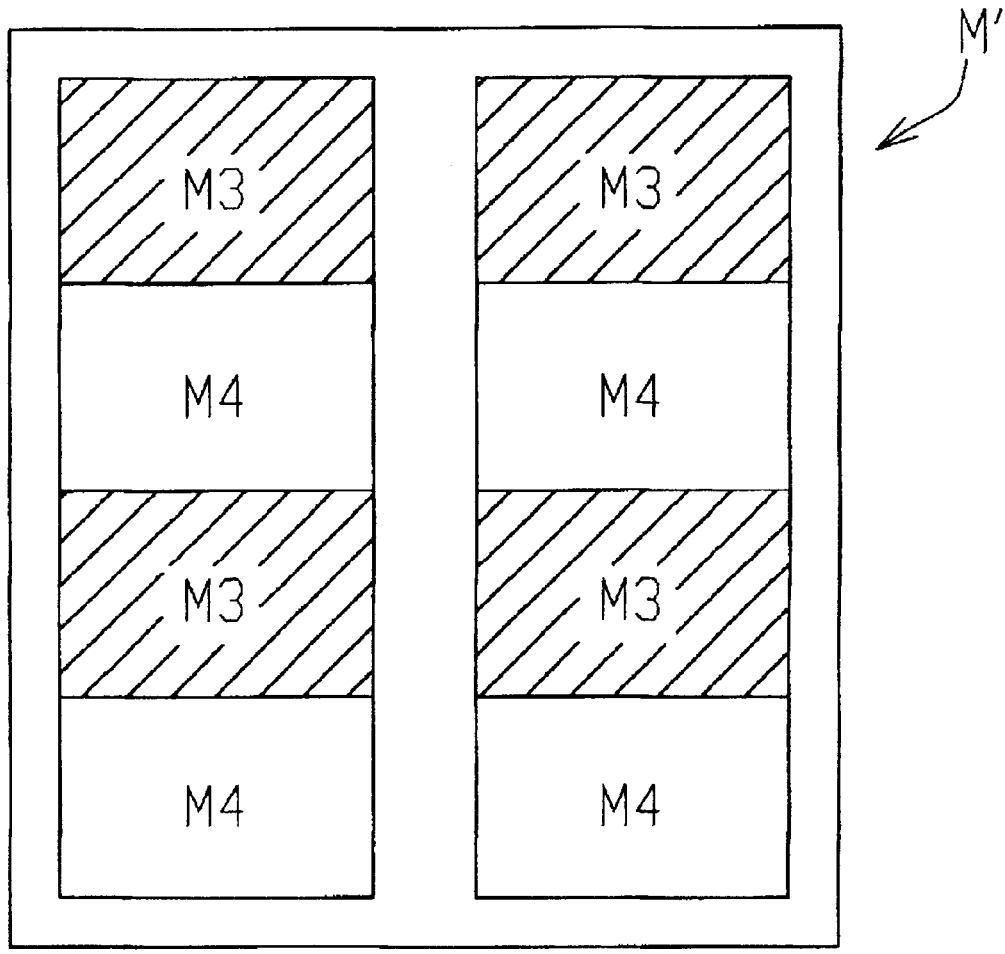
FIG. 10 is a drawing showing a configuration of a mask used in an exposure apparatus of the step-and-repeat method.
Figure 11:
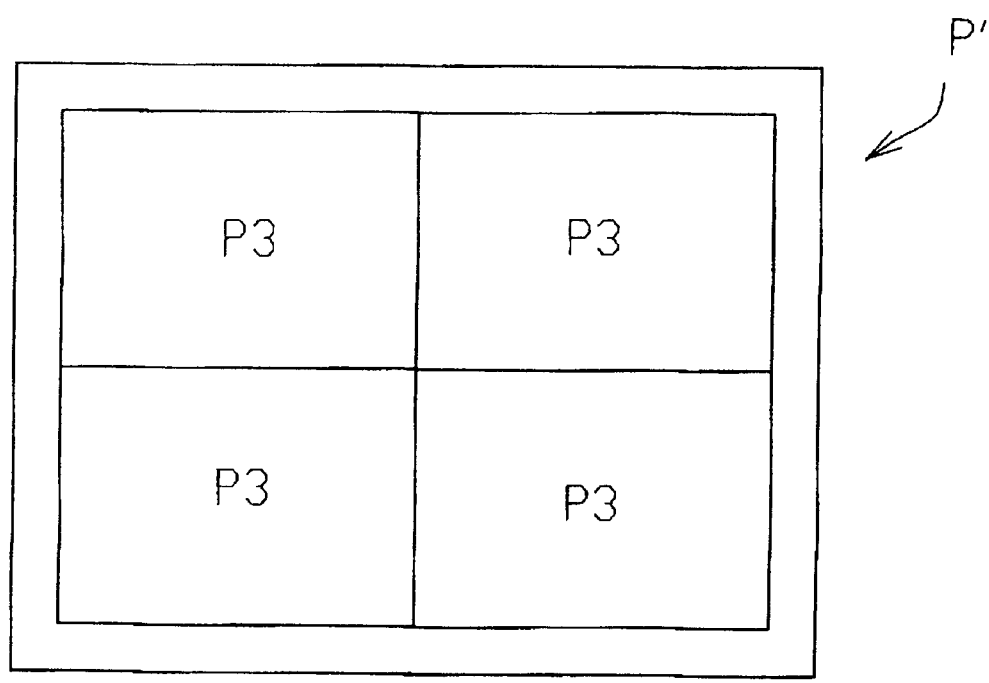
FIG. 11 is a drawing showing a configuration of a plate resulting from pattern exposure with the exposure apparatus of the step-and-repeat method.

The present embodiment described the example of the exposure apparatus of the step-and-scan method, but the present invention is also applicable to exposure apparatus of the step-and-repeat method and exposure apparatus of the return exposure method. In the case of the exposure apparatus of the step-and-repeat method, for example as shown in FIG. 10, first patterns M3 and second patterns M4 are formed on a mask M'. Then enlarged images of the selected first patterns M3 or second patterns M4 are projected into respective regions P3 on a plate P', for example, as shown in FIG. 11.

Figure 12:
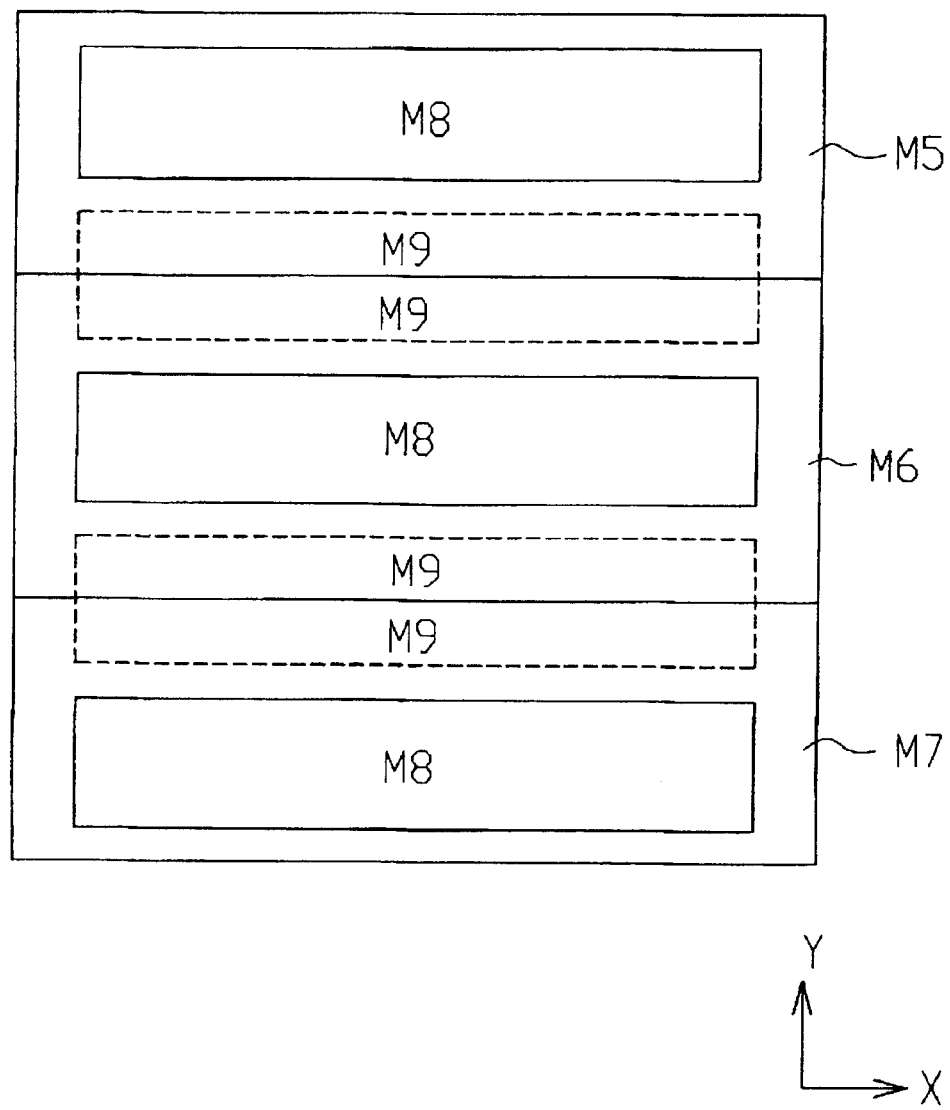
FIG. 12 is a drawing showing a configuration of another mask according to the embodiment.

In the present embodiment the first patterns M1 and the second patterns M2 are provided on the single mask M, but it is also possible to adopt a configuration wherein the first patterns and the second patterns are provided as divided on a plurality of masks arranged discretely and these masks are supported on the mask stage. Namely, as shown in FIG. 12, for example, three masks M5, M6, M7 are arranged in order on the mask stage. The first patterns M8 are arranged discretely on the masks M5, M6, and M7, and each of the first patterns M8 formed on the respective masks M5, M6, M7 is enlarged and projected by at least one of the projection optical units PL1-PL5. Similarly, the second patterns M9 are also arranged discretely on the masks M5, M6, M7, and each of the second patterns M9 formed on the respective masks M5, M6, M7 is enlarged and projected by at least one of the projection optical units PL1-PL5. In this case, increase is prevented in the size of the masks, whereby the cost of the masks can be reduced.

Figure 13:
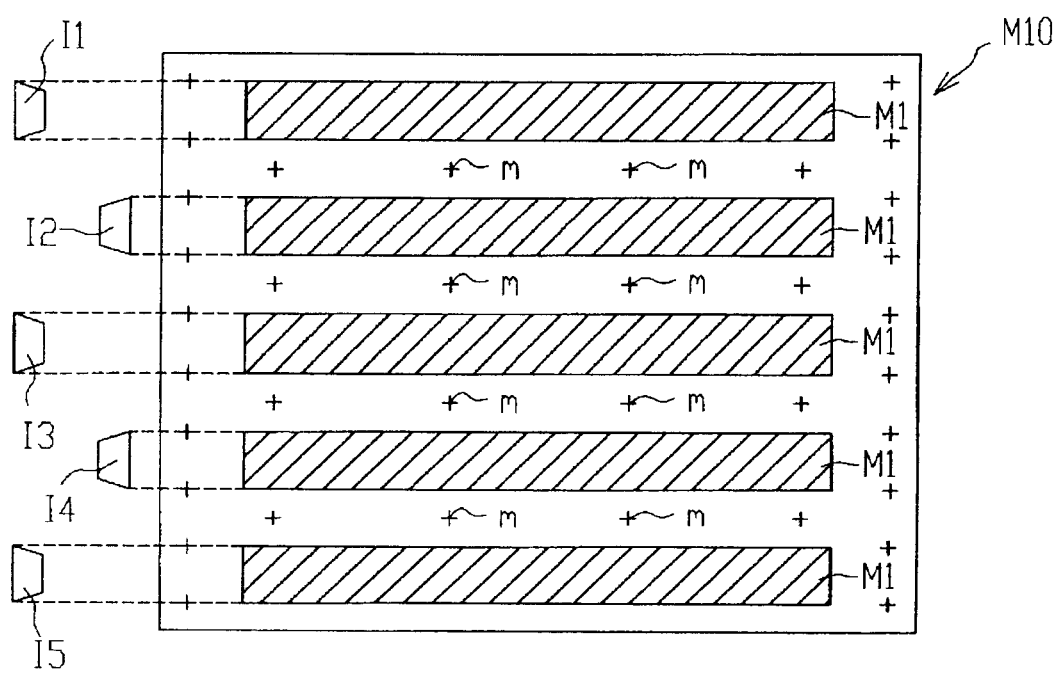
FIG. 13 is a drawing showing a configuration of another mask according to the embodiment.

The present embodiment described the example of the mask M wherein the first patterns M1, second patterns M2, and position measurement marks m, m0, m1 were formed, but it is also possible to use a mask M10 in which first patterns M1 and position measurement marks m are formed, as shown in FIG. 13. In this case, deformation of the mask M10 can be highly accurately detected because some of the position measurement marks m are formed between the first patterns M1.

The present embodiment was arranged to effect switching between the first patterns M1 and the second patterns M2 by the Y-directional step movement of the mask M, but it is also possible to implement the switching between the first patterns M1 and the second patterns M2 by rotating the mask M by 180° and mounting it, instead of the step movement of the mask M (mask stage). It is also possible to implement the switching between the first patterns M1 and the second patterns M2 by preliminarily displacing the position of the mask to be mounted on the mask stage.

In a technology of effecting overlap exposure of two mask patterns on a single plate to improve the resolving power of patterns by double exposure, the patterns can be drawn separately on a single mask and the separate patterns are subjected to double exposure on the same plate, thereby improving the resolving power of patterns with the single mask.

The exposure apparatus in this embodiment has the aerial image measuring device 24 on the plate stage PS, but the exposure apparatus may be so arranged that at least one measuring system for measuring the position measurement marks m, m0, m1 is located on the projection optical system PL side of the mask stage or on the illumination optical system IL side of the mask stage. The measurement system may be provided corresponding to each of the projection optical units PL1-PL5, or one measurement system may be provided for two or more projection optical units. In this case, it is possible to perform an operation of pre-reading the positions of the position measurement marks m in real time during the scanning exposure and to drive the adjusting mechanisms of the respective projection optical units PL1-PL5 in real time to adjust the image positions, which eliminates the need for measuring the deformation of the mask M and the relative positional deviation of the images formed by the respective projection optical units PL1-PL5, before the exposure and which can thus improve the throughput.

The present embodiment showed the example of combining the first patterns M1 by the projection optical system PL to effect exposure of one pattern, but it is also possible to design the first patterns so that resultant patterns are two patterns. It is needless to mention that on that occasion a portion separating the two patterns does not have to be subjected to overlap exposure as an overlap portion.

In the case where the device patterns being the first patterns are provided in the first pattern regions and where only the position measurement marks are provided in the second pattern regions, the pitch of the patterns in the first pattern regions and the magnification of the projection optical system can be smaller than 2.4 times, and the magnification can be set to 1.1× to 1.2× or more.

When the pattern regions are separated so as to provide first pattern regions, second pattern regions, and third pattern regions in the mask, it is a matter of course that the magnification of the projection optical system is naturally 3.3-3.6× or more, which is larger than 3×.

Figure 14:
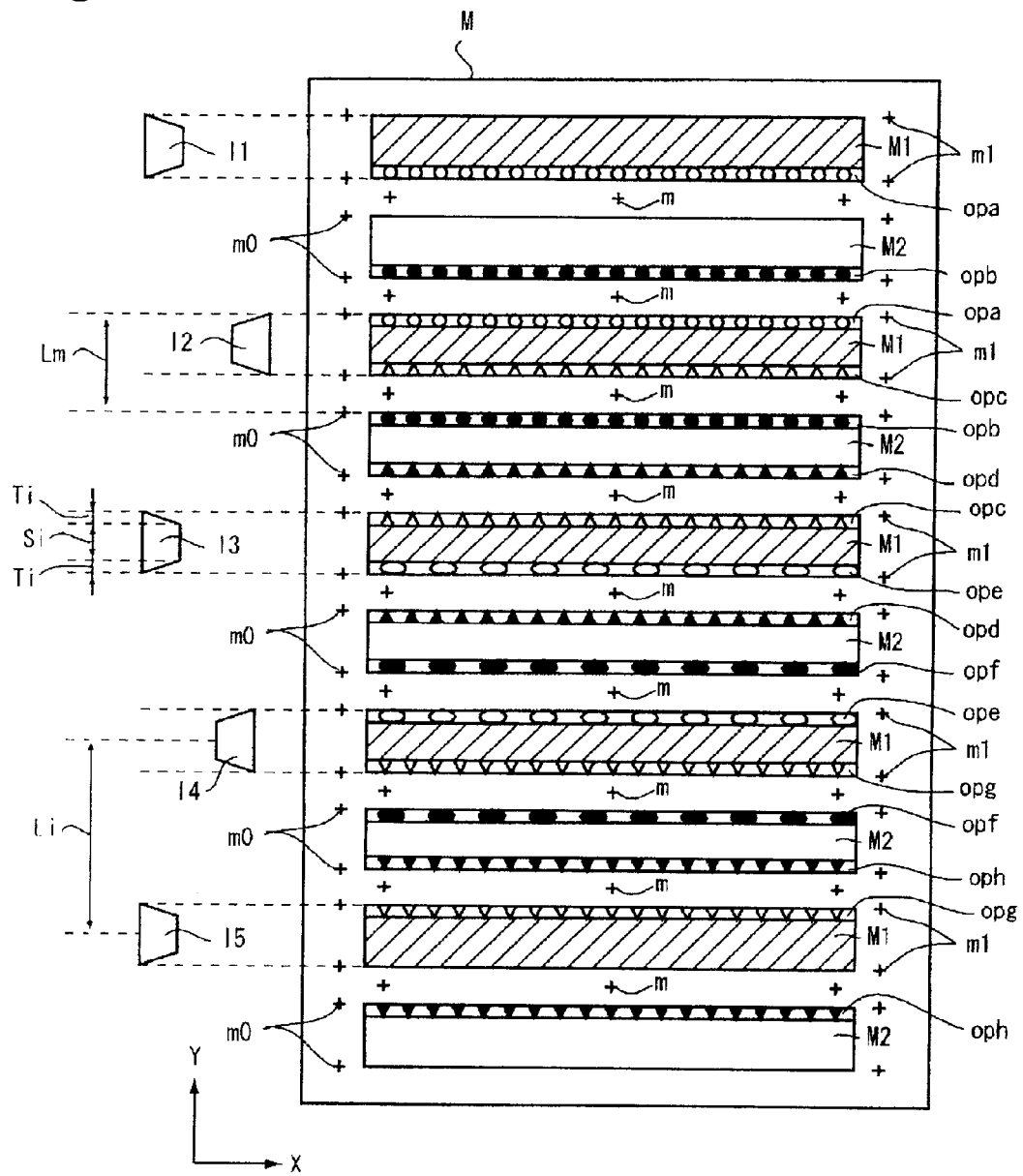
FIG. 14 is a drawing showing a configuration of a mask for erect image according to another embodiment.

Other embodiments of the present invention will be described below with reference to FIGS. 14 to 29. First, let us describe a mask for erect image used in the case where the projection optical units PL1-PL5 are erecting optical systems. As shown in FIG. 14, the mask M has odd-row pattern regions M1 (five pattern regions herein), and even-row pattern regions M2 (five pattern regions herein). Here the odd-row pattern regions M1 refer to odd-numbered pattern regions when counted from top in the non-scanning direction (Y-direction), for example as shown in the same figure, i.e., the first, third, fifth, seventh, and ninth pattern regions; the even-row patterns refer to even-numbered pattern regions when counted similarly from top in the non-scanning direction (Y-direction), i.e., the second, fourth, sixth, eighth, and tenth pattern regions.

Common regions having an identical pattern are formed at edges of at least an adjacent pair of odd-row pattern regions M1 or at least an adjacent pair of even-row pattern regions M2. In this example, the common regions are formed on adjacent sides of an adjacent pair of odd-row pattern regions M1 or an adjacent pair of even-row pattern regions M2. For example, as shown in FIG. 14, the common regions opa, opb, opc, opd, ope, opf, opg, and oph are formed. At least some of the even-row pattern regions M2 are disposed between at least an adjacent pair of odd-row pattern regions M1. The other part is much the same as in FIG. 2 and the description thereof is omitted herein.

Figure 15:
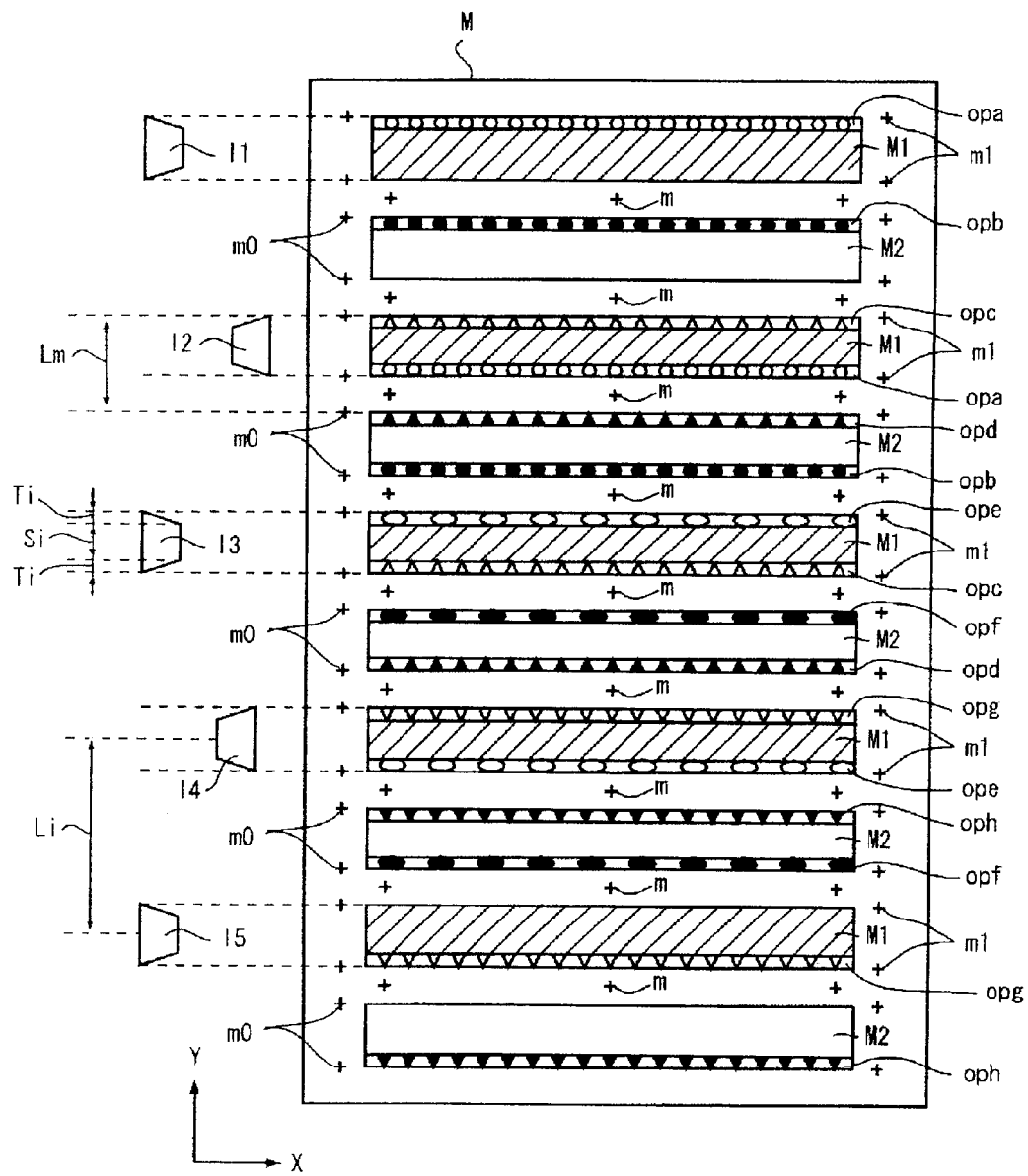
FIG. 15 is a drawing showing a configuration of a mask for inverted image according to another embodiment.

Next, let us describe a mask for inverted image used in the case where the projection optical units PL1-PL5 are inverting optical systems. As shown in FIG. 15, the mask M has odd-row pattern regions M1 (five pattern regions herein), and even-row pattern regions M2 (five pattern regions herein) as in the case shown in FIG. 14. Here the odd-row pattern regions refer to odd-numbered pattern regions when counted from top in the non-scanning direction (Y-direction), for example as shown in FIG. 15, i.e., the first, third, fifth, seventh, and ninth pattern regions; the even-row patterns refer to even-numbered pattern regions when counted similarly from top in the non-scanning direction (Y-direction), i.e., the second, fourth, sixth, eighth, and tenth pattern regions.

Common regions having an identical pattern are formed at edges of at least an adjacent pair of odd-row pattern regions M1 or at least an adjacent pair of even-row pattern regions M2. The common regions herein are formed on opposite sides (sides opposite to the adjacent sides) of an adjacent pair of odd-row pattern regions M1 or an adjacent pair of even-row pattern regions M2. For example, as shown in FIG. 15, the common regions opa, opb, opc, opd, ope, opf, opg, and oph are formed. At least some of the even-row pattern regions M2 are disposed between at least an adjacent pair of odd-row pattern regions M1. The other part is much the same as in FIG. 2, and the description thereof is omitted herein.

Each of the odd-row pattern regions M1 and the even-row pattern regions M2 may be a configuration of one pattern region.

In the description of the mask for erect image and the mask for inverted image, the term "adjacent" does not have to mean contact between the odd-row pattern regions M1 and between the even-row pattern regions M2, but the pattern regions adjacent to each other may be located a predetermined distance apart from each other. Among an adjacent pair of odd-row pattern regions M1 or an adjacent pair of even-row pattern regions M2, at least a pair of common regions oa, opb, opc, opd, ope, opf, opg, oph are transferred as overlapping each other totally or partly to effect such exposure that the overlap regions form one target pattern. A pair of odd-row pattern regions M1 and a pair of even-row pattern regions M2 may be arranged so that at least an adjacent pair of common regions have patterns to form one target pattern when overlaid, and the patterns formed in a pair of common regions do not have to completely agree with each other. For example, among a pair of common regions, one of the common regions of the odd-row pattern regions M1 or one of the common regions of the even-row pattern regions M2 may include an unnecessary pattern that is not used at all.

There are no particular restrictions on the width of the odd-row pattern regions M1 and the even-row pattern regions M2 in the non-scanning direction (Y-direction) of the patterns on the mask M, but the width is preferably 35 mm-175 mm.

Figure 16:
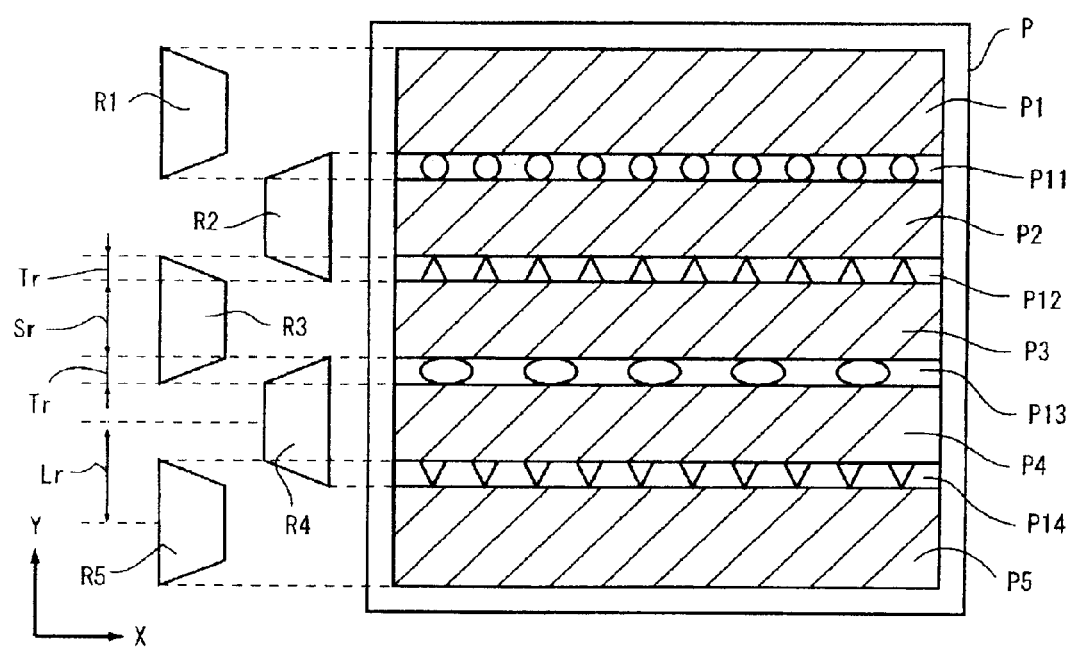
FIG. 16 is a drawing showing a configuration of a plate in a case of an exposure process with odd-row patterns according to another embodiment.
Figure 17:
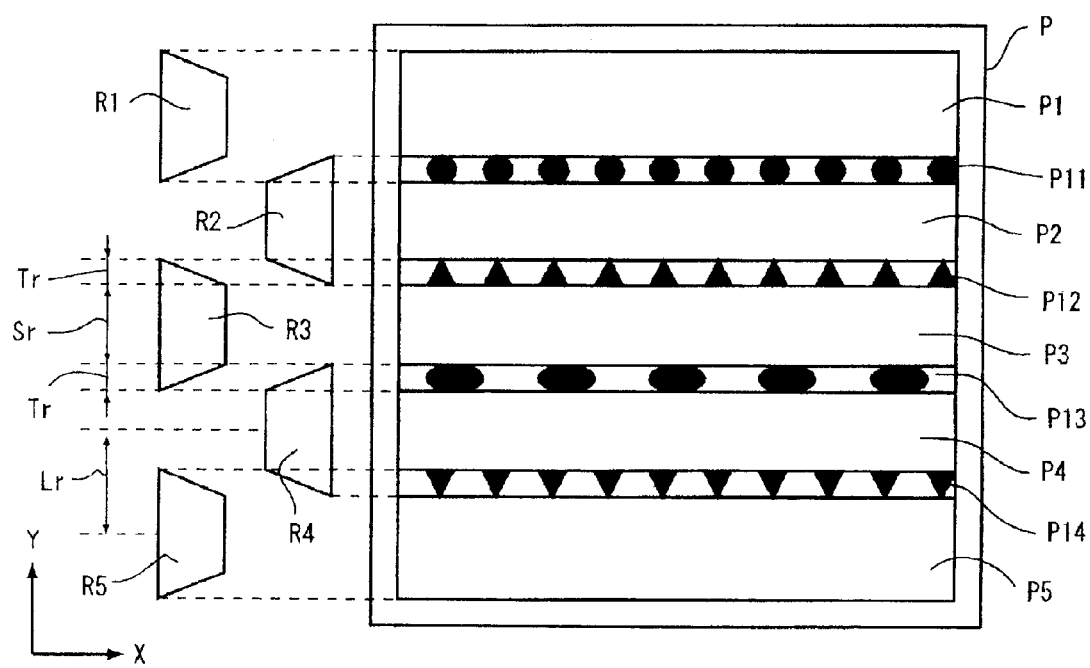
FIG. 17 is a drawing showing a configuration of a plate in a case of an exposure process with even-row patterns according to another embodiment.

FIG. 16 shows a case where the patterns are transferred onto the plate P, using the odd-row pattern regions M1 of the mask M shown in FIG. 14 or in FIG. 15, and FIG. 17 shows a case where the patterns are transferred onto the plate P, using the even-row pattern regions M2 of the mask M shown in FIG. 14 or in FIG. 15. As shown in FIG. 16 or in FIG. 17, each of exposure regions R1-R5 consists of a portion of width Sr and portions of width Tr, and each of the portions of width Tr is a common region between adjacent exposure regions on the plate P. In this embodiment, the width in the non-scanning direction Y of the exposure regions R1-R5 is comprised of the portion of width Sr and the portions of width Tr resulting from multiplication of the portion of width Si and portions of width Ti shown in FIGS. 14 and 15, by the magnification of the projection optical units PL1-PL5, and the effective exposure width resulting from averaging of the widths in the non-scanning direction of the exposure regions R1-R5 is given by (Tr+Sr), which is equal to the pitch distance Lr of the exposure regions R1-R5. Namely, when the pitch distance Lr of the exposure regions R1-R5 is equal to the array pitch of the projection optical units PL1-PL5 in the non-scanning direction Y, the pattern pitch Lm of the patterns M1, M2 of the mask M is determined once the pitch distance Lr of the exposure regions R1-R5 and the magnification of the projection optical units PL1-PL5 are set.

Therefore, though there are no particular restrictions, for example, in a case where the enlargement magnification of the projection optical units PL1-PL5 in the present embodiment is 2x and the effective exposure width 350 mm, the pattern pitch Lm is found to be 175 mm. Since the pitch distance Lr of the exposure regions R1-R5 is determined to be the same as the array pitch of the projection optical units PL1-PL5 in the non-scanning direction Y, the minimum pitch of the pattern pitch Lm in the present embodiment is also associated with the array pitch of the projection optical units PL1-PL5 in the non-scanning direction Y. While consideration is given to factors including the thickness of holds for holding the projection optical units PL1-PL5, let us suppose that a width enough to avoid contact between projection optical units is, for example, 70 mm and that the enlargement magnification of the projection optical units PL1-PL5 is 2x; then the pattern pitch Lm is found to be 35 mm.

On the other hand, there are no particular restrictions on the width of the common regions in the non-scanning direction Y, but the width is preferably a visually recognizable one, and is preferably not more than about 20% of the pattern pitch Lm. Therefore, for example, supposing the pattern pitch Lm in the present embodiment is 175 mm, the width of the common regions is preferably 1 mm-35 mm.

On the mask M of the present embodiment, a light shield zone may be formed, for example, of a light shield sheet or the like around or in part of the odd-row pattern regions M1, the even-row pattern regions M2, and the common regions, in order to prevent exposure of an unwanted pattern formed in the periphery or in part on the mask, erroneous exposure with leak light from the plate P, and so on.

Figure 18:
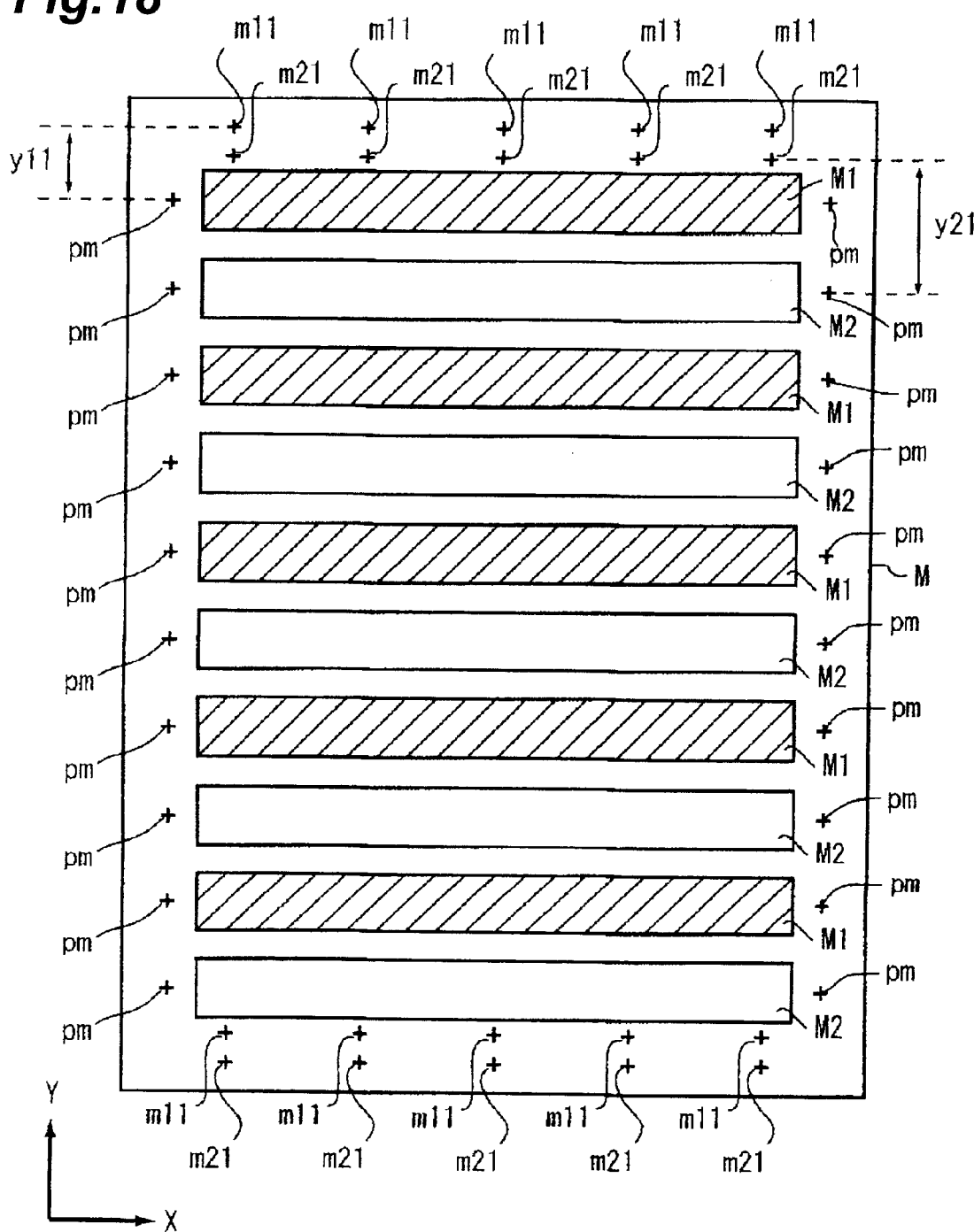
FIG. 18 is a drawing showing a configuration of another mask according to another embodiment.

As shown in FIG. 18, a mask M has a plurality of first position detection marks m11 formed in a predetermined positional relation with odd-row pattern regions M1, and a plurality of second position detection marks m21 formed in a predetermined positional relation with even-row pattern regions M2. Here the first position detection marks m11 and the second position detection marks m21 are alignment marks for alignment of the mask M with the apparatus or alignment marks for adjustment of arrangement of the projection optical units PL1-PL5. The first position detection marks m11 and the second position detection marks m21 may be alignment marks for detection of deformation across the entire surface of the mask M, alignment marks for detection of a drawing error of the odd-row pattern regions M1 and a drawing error of the even-row pattern regions M2, alignment marks for detection of relative positional deviation (connection error) of images of the odd-row pattern regions M1 or the even-row pattern regions M2 formed by the respective projection optical units PL1-PL5, or the like. In the same drawing, the plurality of first position detection marks m11 are arranged in a direction along the scanning direction X and at positions a predetermined distance apart (as an example, a distance y11 from the first odd-row pattern M1 counted from top in the non-scanning direction Y) with respect to the plurality of odd-row pattern regions M1, and the plurality of second position detection marks m21 are arranged in the direction along the scanning direction X and at positions a predetermined distance apart (as an example, a distance y21 from the second even-row pattern M2 counted from top in the non-scanning direction Y) with respect to the even-row pattern region M2.

In the same drawing, pm represents marks indicating centers of the respective pattern regions M1, M2 in the non-scanning direction Y. There are no particular restrictions on the positions of the first position detection marks m11 and the second position detection marks m21, but they may be located in two end portions (upper end portion and lower end portion in FIG. 18) in the non-scanning direction Y, as shown in FIG. 18. However, these first position detection marks m11 and second position detection marks m21 may be located in regions between the pattern regions M1, M2 or in the other regions.

Figure 19:
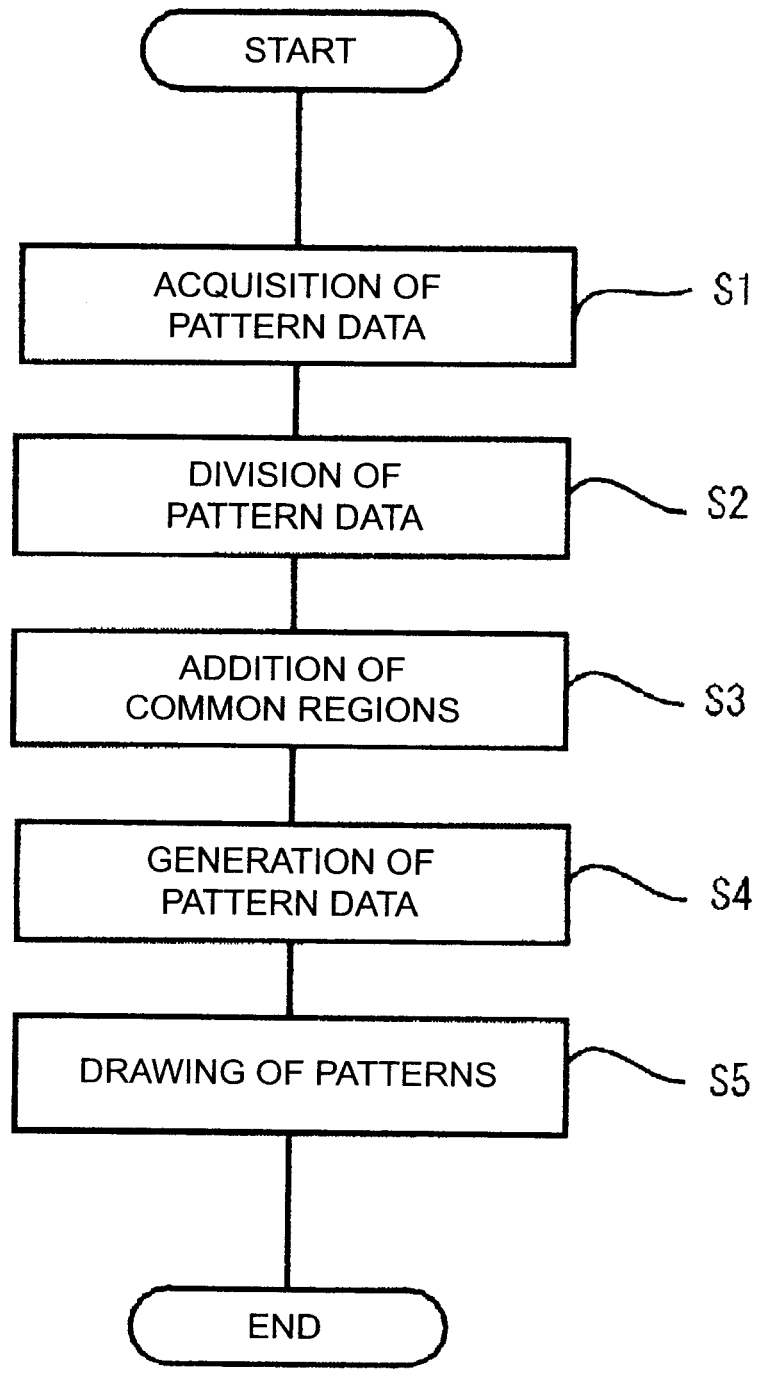
FIG. 19 is a flowchart showing a mask manufacture method according to another embodiment.

A manufacture method of the mask M for erect image described above will be described below with reference to the flowchart shown in FIG. 19. This manufacture method is roughly comprised of a pattern data acquiring block S1, a pattern data dividing block (first block and second block) S2, a common region adding block (third block) S3, a pattern data generating block (third block) S4, and a pattern drawing block (fourth block) S5.

Figure 20:
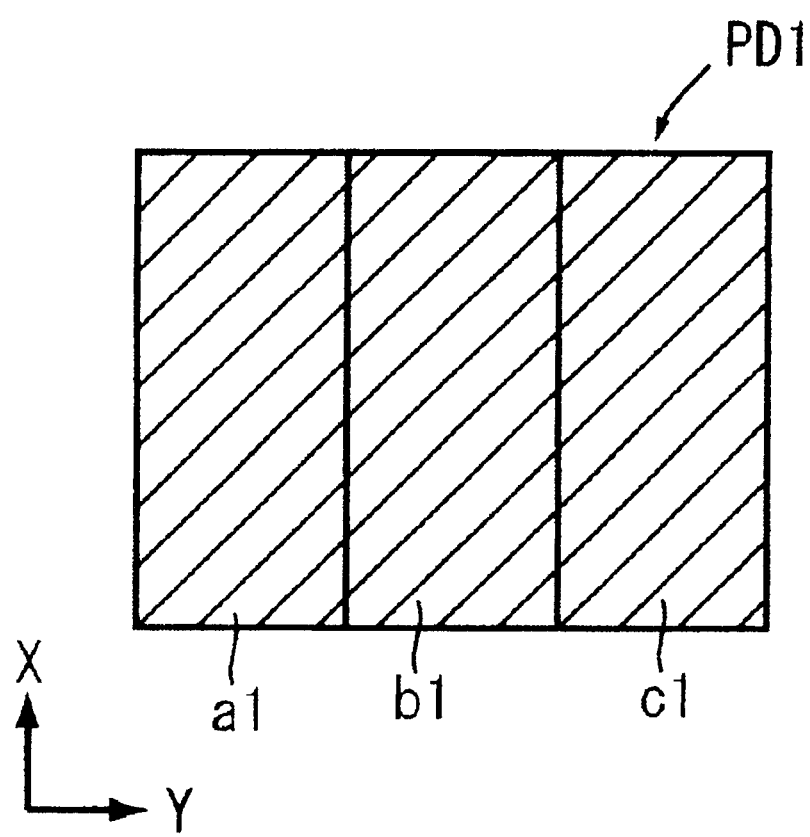
FIG. 20 is a drawing for explaining a dividing block of pattern data as to odd-row patterns according to another embodiment.
Figure 21:
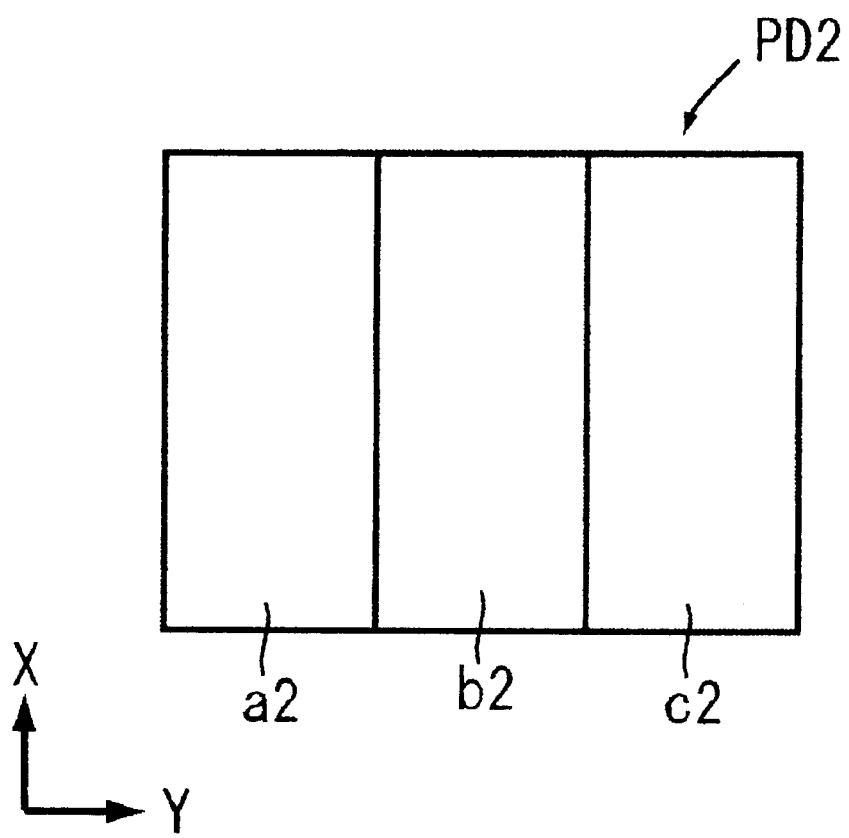
FIG. 21 is a drawing for explaining a dividing block of pattern data as to even-row patterns according to another embodiment.

The first pattern data acquiring block S1 is to acquire first pattern data corresponding to a device pattern to be transferred onto one layer on a plate P and to acquire second pattern data corresponding to a device pattern to be transferred onto another layer on the plate P. When the first pattern data and the second pattern data are those to be transferred onto different exposure regions on the same plate P, they may be first and second pattern data corresponding to device patterns to be formed in the respective exposure regions; when they are those to be transferred onto different plates P, they may be first and second pattern data corresponding to device patterns to be formed on the respective plates P. These pattern data are data reduced by an inverse of the projection magnification of the projection optical units PL1-PL5. In the next pattern data dividing block S2, as shown in FIGS. 20 and 21, each of the first pattern data PD1 and the second pattern data PD2 is divided to generate first divided data units a1, b1, c1 and second divided data units a2, b2, c2. It is assumed herein that the first pattern data units a1, b1, c1 are patterns to be formed in the odd-row pattern regions M1 on the mask M and that the second divided data units a2, b2, c2 are patterns to be formed in the even-row pattern regions M2 on the mask M.

Figure 22:
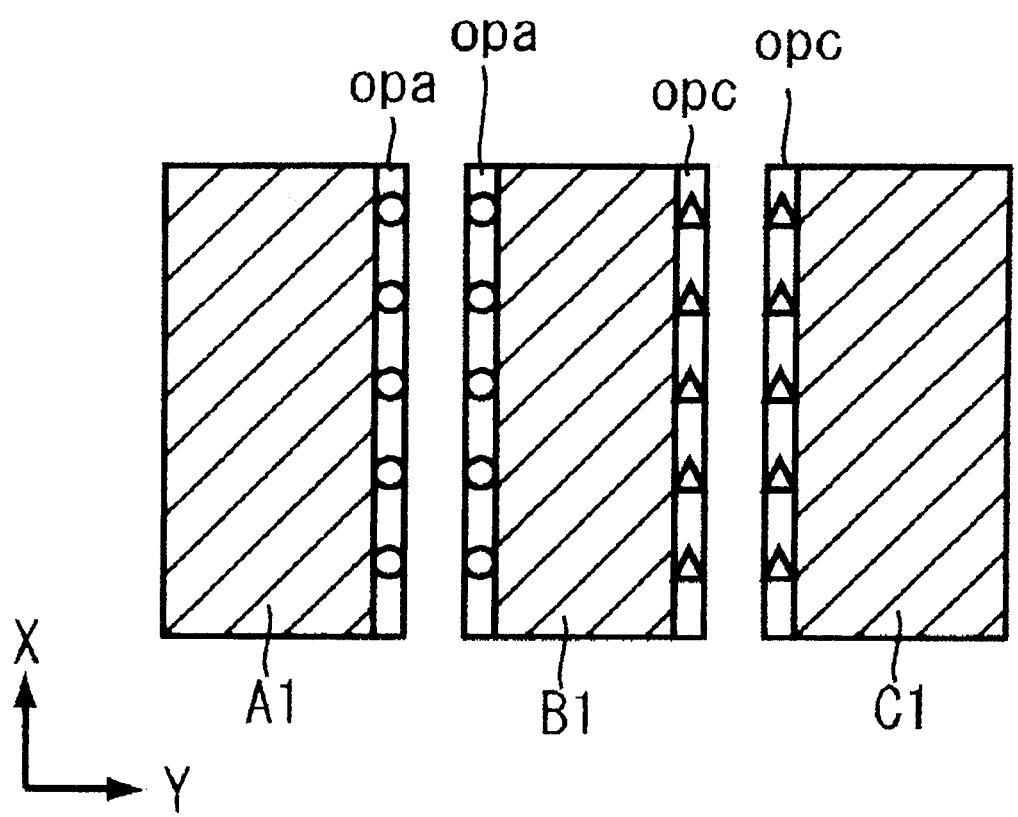
FIG. 22 is a drawing for explaining a common region adding block as to odd-row patterns in manufacture of a mask for erect image according to another embodiment.
Figure 23:
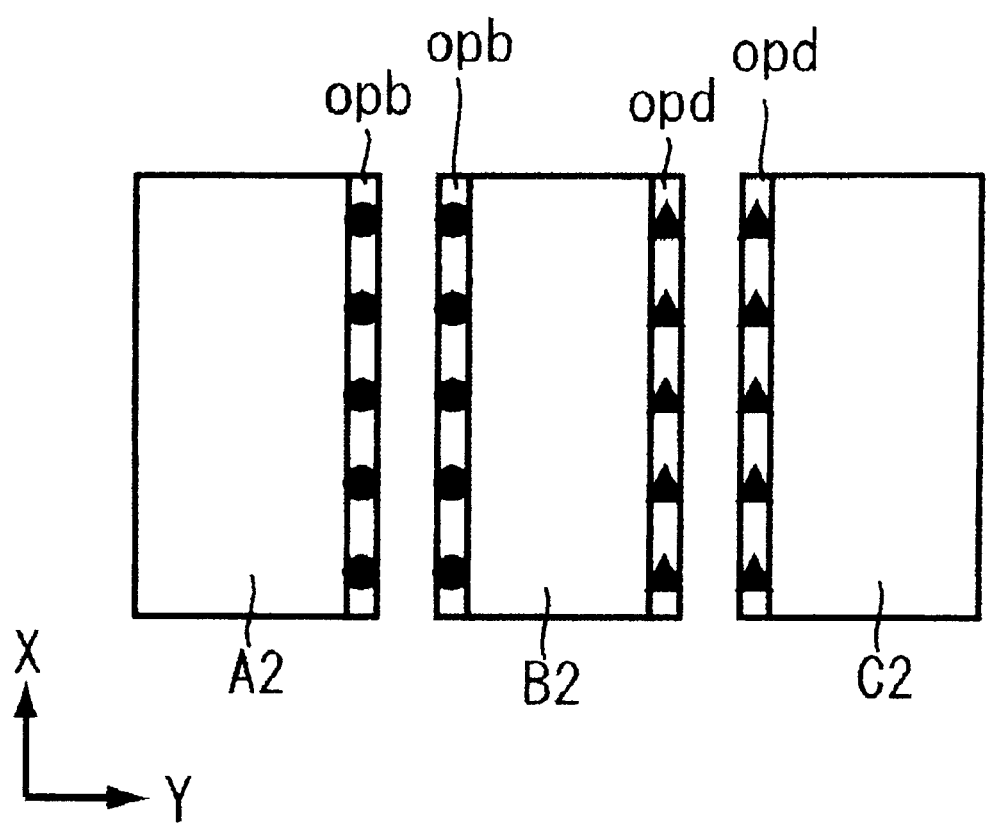
FIG. 23 is a drawing for explaining a common region adding block as to even-row patterns in manufacture of a mask for erect image according to another embodiment.

After completion of the pattern division in the pattern data dividing block S2, the common region adding block S3 is carried out to add pattern data corresponding to the common regions to edges of at least a pair of first divided data units or at least a pair of second divided data units, as shown in FIGS. 22 and 23, and then the pattern data generating block S4 is carried out to generate odd-row pattern drawing data and even-row pattern drawing data corresponding to all the patterns to be formed on the mask.

The addition of the pattern data corresponding to the common regions for the first divided data units is implemented, as shown in FIG. 22, by adding data of the portion opa corresponding to an edge region of first divided data A1 (an edge region on the adjacent first divided data B1 side herein) to a corresponding edge region of first divided data B1 (an edge region on the adjacent first divided data A1 side herein) and by adding data of the portion opc corresponding to an edge region of first divided data B1 (an edge region on the adjacent first divided data C1 side herein) to a corresponding edge region of first divided data C1 (an edge region on the adjacent first divided data B1 side herein). However, it may also be implemented by adding data of the portion opa corresponding to the edge region of first divided data B1 (the edge region on the adjacent first divided data A1 side herein) to the corresponding edge region of first divided data A1 (the edge region on the adjacent first divided data B1 side herein) and by adding data of the portion opc corresponding to the edge region of first divided data C1 (the edge region on the adjacent first divided data B1 side herein) to the corresponding edge region of first divided data B1 (the edge region on the adjacent first divided data C1 side herein).

The addition of the pattern data corresponding to the common regions for the second divided data units is implemented, as shown in FIG. 23, by adding data of the portion opb corresponding to an edge region of second divided data A2 (an edge region on the adjacent second divided data B2 side herein) to a corresponding edge region of second divided data B2 (an edge region on the adjacent second divided data A2 side herein) and by adding data of the portion opd corresponding to an edge region of second divided data B2 (an edge region on the adjacent second divided data C2 side herein) to a corresponding edge region of second divided data C2 (an edge region on the adjacent second divided data B2 side herein). However, it may also be implemented by adding data of the portion opb corresponding to the edge region of second divided data B2 (the edge region on the adjacent second divided data A2 side herein) to the corresponding edge region of second divided data A2 (the edge region on the adjacent second divided data B2 side herein) and adding data of the portion opd corresponding to the edge region of second divided data C2 (the edge region on the adjacent second divided data B2 side herein) to the corresponding edge region of second divided data B2 (the edge region on the adjacent second divided data C2 side herein).

Figure 24:
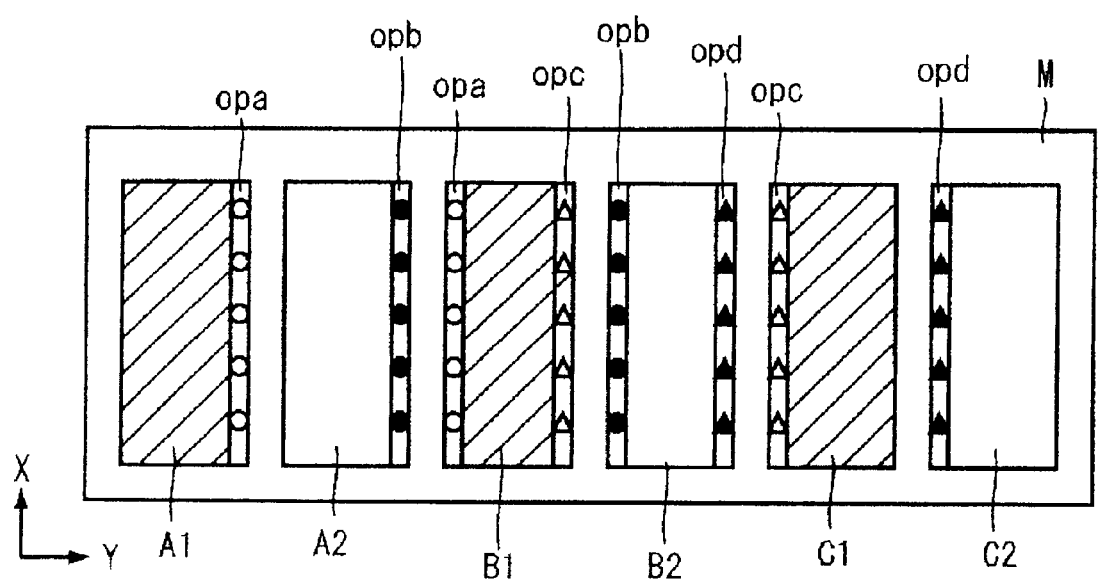
FIG. 24 is a drawing showing a configuration of a mask for erect image fabricated by the manufacture method according to another embodiment.

After completion of the generation of the odd-row pattern drawing data and the even-row pattern drawing data, the pattern drawing block S5 is carried out to draw all the patterns on a mask substrate (blank) in accordance with these data by means of an EB exposure system or the like to fabricate a mask M. At this time, the first divided data units A1, B1, C1 and the second divided data units A2, B2, C2 are alternately drawn as shown in FIG. 24.

A manufacture method of the mask M for inverted image is the same as the above manufacture method as to the pattern data acquiring block S1, pattern data dividing block S2, pattern generating block S4, and pattern drawing block S5, but is different in the process of adding the corresponding pattern data to the common regions in the common region adding block S3.

Figure 25:
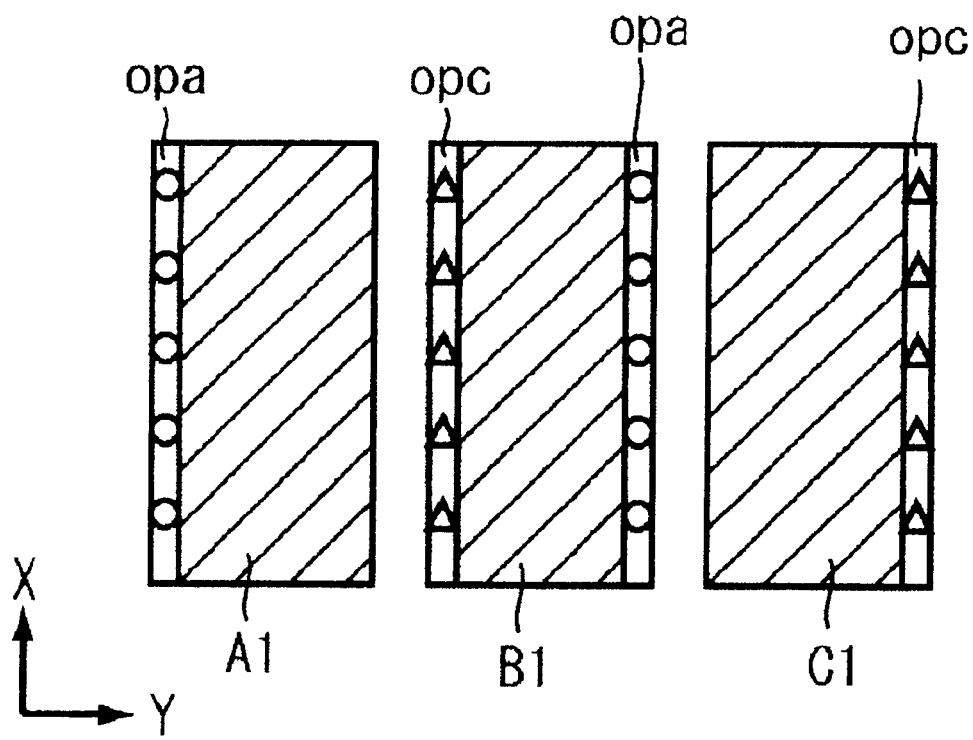
FIG. 25 is a drawing for explaining a common region adding block as to odd-row patterns in manufacture of a mask for inverted image according to another embodiment.
Figure 26:
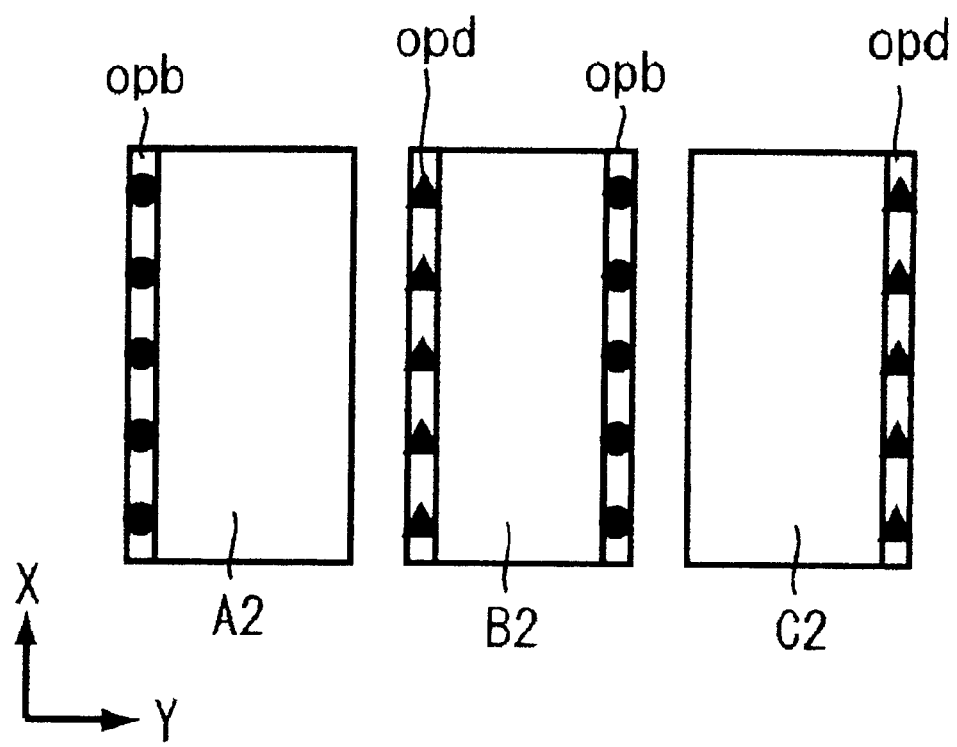
FIG. 26 is a drawing for explaining a common region adding block as to even-row patterns in manufacture of a mask for inverted image according to another embodiment.

Namely, after completion of the pattern division in the pattern data dividing block S2, the pattern data corresponding to the common regions are added to edges of at least a pair of first divided data units or at least a pair of second divided data units, as shown in FIGS. 25 and 26.

The addition of the pattern data corresponding to the common regions for the first divided data units is implemented, as shown in FIG. 25, by adding data of the portion opa corresponding to an edge region of first divided data A1 (an edge region on the side opposite to the adjacent first divided data B1 herein) to a corresponding edge region of first divided data B1 (an edge region on the side opposite to the adjacent first divided data A1 herein) and by adding data of the portion opc corresponding to an edge region of first divided data B1 (an edge region on the side opposite to the adjacent first divided data C1 herein) to a corresponding edge region of first divided data C1 (an edge region on the side opposite to the adjacent first divided data B1 herein). However, the addition may also be implemented by adding data of the portion opa corresponding to the edge region of first divided data B1 (the edge region on the side opposite to the adjacent first divided data A1 herein) to the corresponding edge region of first divided data A1 (the edge region on the side opposite to the adjacent first divided data B1 herein) and by adding data of the portion opc corresponding to the edge region of first divided data C1 (the edge region on the side opposite to the adjacent first divided data B1 herein) to the corresponding edge region of first divided data B1 (the edge region on the side opposite to the adjacent first divided data C1 herein).

The addition of the pattern data corresponding to the common regions for the second divided data units is implemented, as shown in FIG. 26, by adding data of the portion opb corresponding to an edge region of second divided data A2 (an edge region on the side opposite to the adjacent second divided data B2 herein) to a corresponding edge region of second divided data B2 (an edge region on the side opposite to the adjacent second divided data A2 herein) and adding data of the portion opd corresponding to an edge region of second divided data B2 (an edge region on the side opposite to the adjacent second divided data C2 herein) to a corresponding edge region of second divided data C2 (an edge region on the side opposite to the adjacent second divided data B2 herein). However, the addition may also be implemented by adding data of the portion opb corresponding to the edge region of second divided data B2 (the edge region on the side opposite to the adjacent second divided data A2 herein) to the corresponding edge region of second divided data A2 (the edge region on the side opposite to the adjacent second divided data B2 herein) and adding data of the portion opd corresponding to the edge region of second divided data C2 (the edge region on the side opposite to the adjacent second divided data B2 herein) to the corresponding edge region of second divided data B2 (the edge region on the side opposite to the adjacent second divided data C2 herein).

Figure 27:
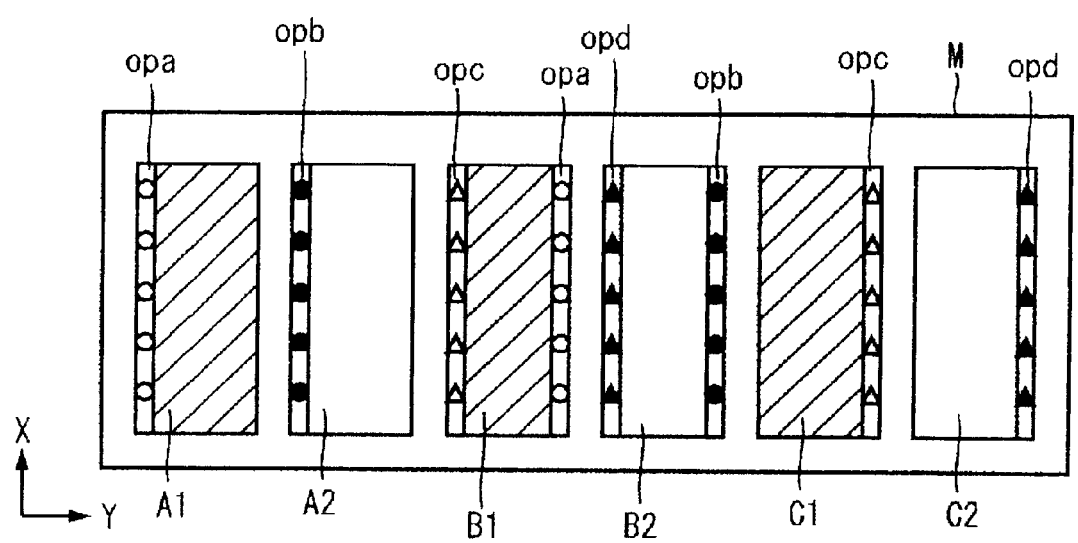
FIG. 27 is a drawing showing a configuration of a mask for inverted image fabricated by a manufacture method according to another embodiment.

After completion of the generation of the odd-row pattern drawing data and the even-row pattern drawing data in the pattern data generating block S4, the pattern drawing block S5 is carried out to draw all the patterns on a mask substrate (blank) in accordance with these data by means of an EB exposure system or the like to fabricate a mask M. At this time, the first divided data units A1, B1, C1 and the second divided data units A2, B2, C2 are alternately drawn as shown in FIG. 27.

Figure 28:
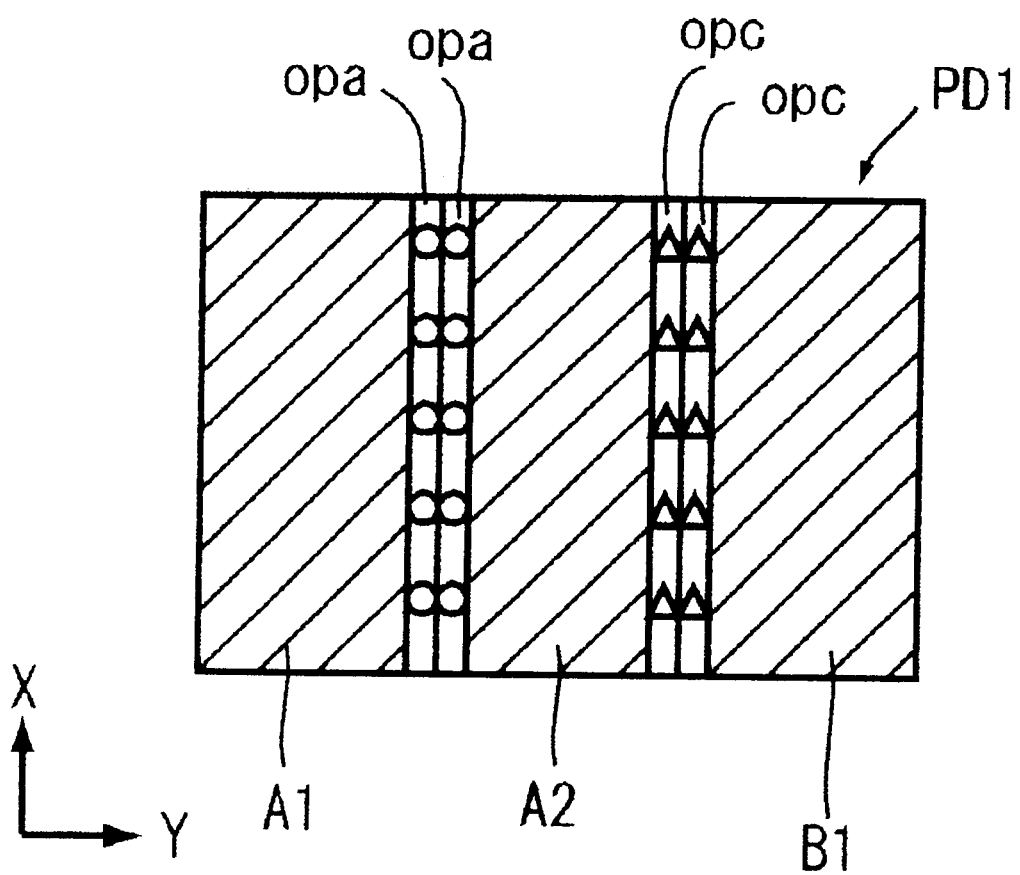
FIG. 28 is a drawing for explaining a dividing block of pattern data as to odd-row patterns in a case without a common region adding block in the mask manufacture method according to another embodiment.
Figure 29:
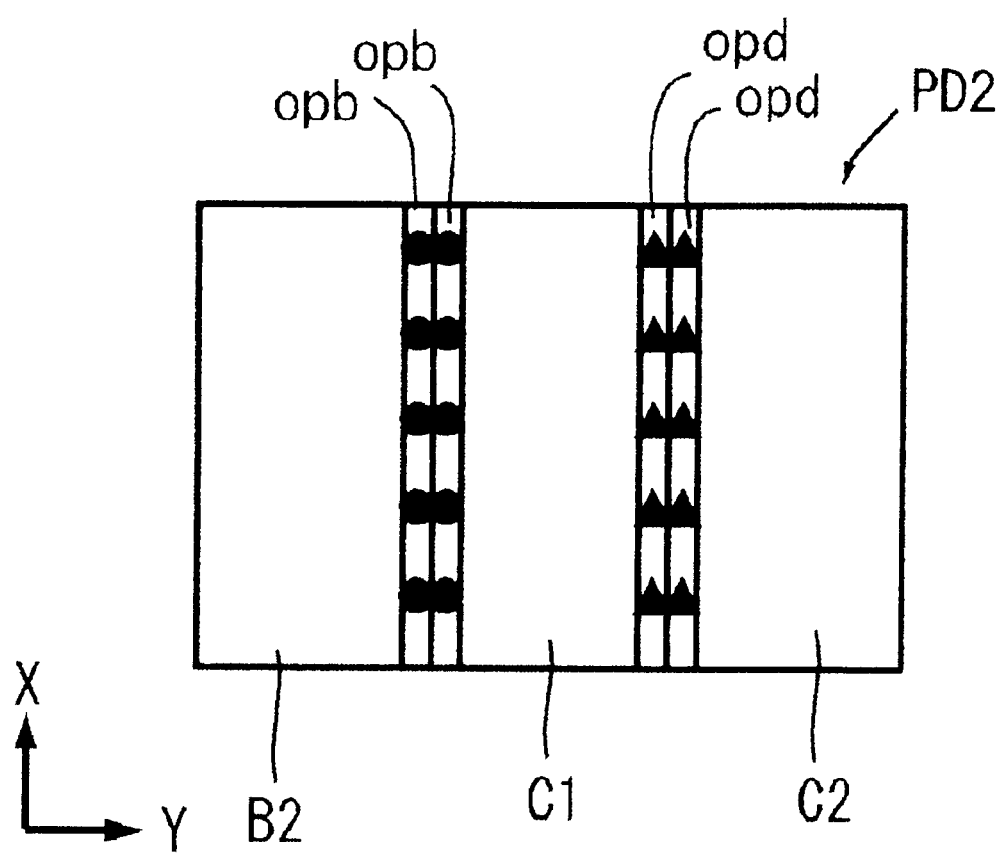
FIG. 29 is a drawing for explaining a dividing block of pattern data as to even-row patterns in a case without a common region adding block in the mask manufacture method according to another embodiment.

The aforementioned pattern data dividing block S2 was arranged to divide the pattern data corresponding to the device patterns, followed by the common region adding block S3, but another manufacture method may be arranged first to divide pattern data corresponding to all the odd-row patterns for at least a pair of odd-row pattern regions with common regions to generate first divided data units (first block), then to divide pattern data corresponding to all the even-row patterns for at least a pair of even-row pattern regions with common regions to generate second divided data units (second block), and thereafter to draw all the odd-row patterns and all the even-row patterns on the mask M, using these first divided data units and second divided data units (third block). The first pattern data PD1 associated with the odd-row patterns in this case is shown in FIG. 28, and the second pattern data PD2 associated with the even-row patterns in FIG. 29. In these drawings, opa, opb, opc, and opd represent the common regions.

It should be noted that the embodiments given above were described for facilitating the understanding of the present invention but not for limiting the present invention. Therefore, the elements disclosed in the above embodiments are intended to embrace all design changes and equivalents belonging to the technical scope of the present invention.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An exposure apparatus which projects and exposes an image of a pattern on a mask onto a photosensitive object, the exposure apparatus comprising:
    a plurality of projection optical units arranged along a first direction, each of the projection optical units being configured to project a magnified image of the pattern arranged on a first surface, onto a second surface on which the photosensitive object is arranged;
    a first supporting device which supports the mask on which a plurality of first patterns are arranged at a predetermined interval in the first direction and on which a plurality of second patterns are arranged at the predetermined interval in the first direction and between the plurality of first patterns, and which arranges the mask on the first surface so as to be movable relative to the plurality of projection optical units; and
    a second supporting device which supports the photosensitive object and arranges the photosensitive object on the second surface,
    wherein the plurality of projection optical units are configured to project magnified images of the first patterns arranged on the first surface, while the first patterns are opposed to the respective projection optical units, to form a first continuous image in the first direction onto the photosensitive object arranged on the second surface, and to project magnified images of the second patterns arranged on the first surface, while the second patterns are opposed to the respective projection optical units, to form a second continuous image in the first direction onto the photosensitive object arranged on the second surface.

2. The exposure apparatus according to claim 1, wherein the plurality of projection optical units are configured to project parts of the magnified images of at least a pair of the first patterns adjacent to each other out of the magnified images of the first patterns, in a mutually superimposed relation onto the photosensitive object, and to project parts of the magnified images of at least a pair of said second patterns adjacent to each other out of the magnified images of the second patterns, in a mutually superimposed relation onto the photosensitive object.

3. The exposure apparatus according to claim 1, wherein the magnified images of the first patterns and the magnified images of the second patterns are projected onto the same photosensitive object.

4. The exposure apparatus according to claim 3, wherein the magnified images of the first patterns are projected in a first region on the photosensitive object, and wherein the magnified images of the second patterns are projected in a second region different from the first region on the photosensitive object.

5. The exposure apparatus according to claim 3, wherein the magnified images of the first patterns are projected in a first region on the photosensitive object, and wherein the magnified images of the second patterns are projected in a second region overlapping at least in part with the first region on the photosensitive object.

6. The exposure apparatus according to claim 5, wherein the magnified images of the first patterns and the magnified images of the second patterns are projected as a double exposure on each other onto the photosensitive object.

7. The exposure apparatus according to claim 1, wherein the photosensitive object comprises a first photosensitive object and a second photosensitive object different from each other, wherein the magnified images of the first patterns are projected onto the first photosensitive object, and wherein the magnified images of the second patterns are projected onto the second photosensitive object.

8. The exposure apparatus according to claim 1, wherein the plurality of the projection optical units have a magnification larger than 2.

9. The exposure apparatus according to claim 1, wherein the first supporting device and the second supporting device move the mask and the photosensitive object at a speed ratio equal to a magnification of the plurality of projection optical units in a second direction intersecting with the first direction.

10. The exposure apparatus according to claim 1, wherein the first supporting device implements step movement of the mask in the first direction in accordance with the interval in the first direction of the first patterns and the second patterns, to cause the plurality of first patterns or the plurality of second patterns to be opposed to the respective projection optical units.

11. The exposure apparatus according to claim 1,
wherein the first supporting device causes the plurality of first patterns or the plurality of second patterns to be opposed to the respective projection optical units, based on exposure information entered into the exposure apparatus in order to select either of the first patterns and the second patterns.

12. The exposure apparatus according to claim 1, further comprising:
an image measuring device for measuring images formed by the plurality of projection optical units from measurement marks formed at predetermined positions on the mask corresponding to at least either of the first patterns and the second patterns; and
an adjusting device for adjusting the plurality of projection optical units, based on the result of measuring the images of the measurement marks.

13. The exposure apparatus according to claim 1,
wherein the predetermined interval is set corresponding to a magnification of the plurality of projection optical units and a pitch distance in the first direction of a plurality of exposure regions formed by the plurality of projection optical units.

14. The exposure apparatus according to claim 1,
wherein the mask comprises a plurality of mask substrates arranged discretely along the first direction,
wherein the plurality of first patterns and the plurality of second patterns each are provided separately on the plurality of mask substrates, and
wherein the first supporting device supports the plurality of mask substrates arranged discretely along the first direction.

15. A method of manufacturing a device, the method comprising:
projecting a pattern on a mask onto a photosensitive substrate to effect exposure, by using the exposure apparatus according to claim 1; and
developing the photosensitive substrate on which the pattern has been projected.

16. An exposure apparatus which projects and exposes an image of a pattern on a mask onto a photosensitive object, the exposure apparatus comprising:
a plurality of projection optical units arranged along a first direction, each of the projection optical units being configured to carry out a projection exposure to form a magnified image of the pattern arranged on a first surface, onto a second surface on which the photosensitive object is arranged;
a first supporting device which supports the mask on which a plurality of first patterns formed by dividing a first device pattern in the first direction are arranged at a predetermined interval in the first direction and on which a plurality of second patterns formed by dividing a second device pattern in the first direction are arranged at the predetermined interval in the first direction and between the plurality of first patterns, and which arranges the mask on the first surface so as to be movable relative to the plurality of projection optical units; and
a second supporting device which supports the photosensitive object and arranges the photosensitive object on the second surface,
wherein the plurality of projection optical units project magnified images of the first patterns arranged on the first surface, while the first patterns are opposed to the respective projection optical units, onto the photosensitive object arranged on the second surface, to project a magnified image of the first device pattern, which is continuous in the first direction, onto the photosensitive object, and project magnified images of the second patterns arranged on the first surface, while the second patterns are opposed to the respective projection optical units, onto the photosensitive object arranged on the second surface, to project a magnified image of the second device pattern, which is continuous in the first direction, onto the photosensitive object.

17. A method of manufacturing a device, the method comprising:
projecting a pattern on a mask onto a photosensitive substrate to effect exposure, by using the exposure apparatus according to claim 16; and
developing the photosensitive substrate on which the pattern has been projected.

18. A photomask on which a pattern to be transferred onto a photosensitive object is formed, the photomask comprising:
a plurality of first patterns which are arranged discontinuously at a predetermined interval in a first direction and which are to be subjected to a projection exposure to project magnified images of the first patterns onto the photosensitive object so as to form a first image that is continuous in the first direction onto the photosensitive object; and
a plurality of second patterns which are arranged discontinuously at the predetermined interval in the first direction, at least one of the second patterns being arranged between two of the plurality of first patterns and which are to be subjected to a projection exposure to project magnified images of the second patterns onto the photosensitive object so as to form a second image that is continuous in the first direction onto the photosensitive object.

19. The photomask according to claim 18,
wherein the first patterns are arranged so that parts of the magnified images of at least a pair of said first patterns adjacent to each other out of the magnified images of the first patterns are formed in a mutually superimposed relation on the photosensitive object, and
wherein the second patterns are arranged so that parts of the magnified images of at least a pair of said second patterns adjacent to each other out of the magnified images of the second patterns are formed in a mutually superimposed relation on the photosensitive object.

20. The photomask according to claim 18,
wherein the first patterns are arranged so that the magnified images of the first patterns are formed onto the photosensitive object by a plurality of projection optical units arranged along the first direction, and
wherein the second patterns are arranged so that the magnified images of the second patterns are formed onto the photosensitive object by the plurality of projection optical units.

21. The photomask according to claim 18,
wherein the first patterns and the second patterns each extend in a second direction intersecting with the first direction.

22. The photomask according to claim 18, further comprising:
a plurality of measurement marks arranged at predetermined positions corresponding to at least either of the plurality of first patterns and the plurality of second patterns.

23. The photomask according to claim 22,
wherein at least a part of the plurality of measurement marks is arranged between adjacent ones of the first and second patterns.

24. The photomask according to claim 18,
wherein first common regions having an identical pattern are provided at edges of at least one pair of said first patterns adjacent to each other out of the plurality of first patterns, and
wherein second common regions having an identical pattern are provided at edges of at least one pair of said second patterns adjacent to each other out of the plurality of second patterns.

25. The photomask according to claim 24,
wherein each of the first common regions is provided on an adjacent side where one of said at least one pair of first patterns adjacent to each other is adjacent to the other, and
wherein each of the second common regions is provided on an adjacent side where one of said at least one pair of second patterns adjacent to each other is adjacent to the other.

26. The photomask according to claim 24,
wherein each of the first common regions is provided on a side opposite to an adjacent side where one of said at least one pair of first patterns adjacent to each other is adjacent to the other, and
wherein each of the second common regions is provided on a side opposite to an adjacent side where one of said at least one pair of second patterns adjacent to each other is adjacent to the other.

27. The photomask according to claim 18,
wherein the predetermined interval is set corresponding to an enlargement magnification of the magnified images of the first patterns and the magnified images of the second patterns.

28. The photomask according to claim 18, comprising:
a plurality of mask substrates arranged discretely along the first direction,
wherein the plurality of first patterns and the plurality of second patterns each are provided separately on the plurality of mask substrates.

29. A method of manufacturing a device, the method comprising:
projecting a pattern on the photomask according to claim 18 onto a photosensitive substrate to effect exposure; and
developing the photosensitive substrate on which the pattern has been projected.

30. A photomask on which a pattern to be transferred onto a photosensitive object is formed, the photomask comprising:
a plurality of first patterns formed by dividing a first device pattern in a first direction, the plurality of first patterns arranged discontinuously at a predetermined interval in the first direction; and
a plurality of second patterns formed by dividing a second device pattern in the first direction, the plurality of second patterns arranged discontinuously at the predetermined interval in the first direction, at least one of the second patterns being arranged between two of the plurality of first patterns.

31. A method of manufacturing a device, the method comprising:
projecting a pattern on the photomask according to claim 30 onto a photosensitive substrate to effect exposure; and
developing the photosensitive substrate on which the pattern has been projected.

* * * * *